United States Patent
Pyeon et al.

(10) Patent No.: US 9,240,227 B2
(45) Date of Patent: *Jan. 19, 2016

(54) DAISY CHAIN CASCADING DEVICES

(75) Inventors: Hong Beom Pyeon, Kanata (CA);
Jin-Ki Kim, Kanata (CA); HakJune Oh, Kanata (CA)

(73) Assignee: Conversant Intellectual Property Management Inc., Ottawa, Ontario (CA)

(*) Notice: Subject to any disclaimer, the term of this patent is extended or adjusted under 35 U.S.C. 154(b) by 7 days.

This patent is subject to a terminal disclaimer.

(21) Appl. No.: 11/594,564

(22) Filed: Nov. 8, 2006

(65) Prior Publication Data

US 2007/0109833 A1 May 17, 2007

Related U.S. Application Data

(63) Continuation-in-part of application No. 11/496,278, filed on Jul. 31, 2006, which is a continuation-in-part of application No. 11/324,023, filed on Dec. 30, 2005, now Pat. No. 7,652,922.

(60) Provisional application No. 60/722,368, filed on Sep. 30, 2005, provisional application No. 60/787,710, filed on Mar. 28, 2006.

(51) Int. Cl.
*G06F 13/28* (2006.01)
*G11C 7/10* (2006.01)
(Continued)

(52) U.S. Cl.
CPC .............. *G11C 7/10* (2013.01); *G06F 13/4247* (2013.01); *G06F 13/4256* (2013.01); *G11C 5/066* (2013.01); *G06F 12/0623* (2013.01); *G11C 16/06* (2013.01)

(58) Field of Classification Search
CPC ............ G06F 13/4256; G06F 13/4247; G06F 12/0623
USPC .............. 362/232; 365/230.03, 233.1; 710/24
See application file for complete search history.

(56) References Cited

U.S. PATENT DOCUMENTS 3,249,270 A 5/1966 Zuckerman
4,174,536 A 11/1979 Misunas et al.
(Continued)

FOREIGN PATENT DOCUMENTS

CN 1147135 4/1997
CN 1591680 3/2005
(Continued)

OTHER PUBLICATIONS

"Toshiba MOS Digital Integrated Circuit Silicon Gate CMOS", TH58NVG1S3AFT05, Toshiba Corporation, May 19, 2003, pp. 1-32.
(Continued)

*Primary Examiner* — Ernest Unelus
(74) *Attorney, Agent, or Firm* — Shin Hung; Borden Ladner Gervais LLP

(57) ABSTRACT

A technique for serially coupling devices in a daisy chain cascading arrangement. Devices are coupled in a daisy chain cascade arrangement such that outputs of a first device are coupled to inputs of a second device later in the daisy chain to accommodate the transfer of information, such as data, address and command information, and control signals to the second device from the first device. The devices coupled in the daisy chain comprise a serial input (SI) and a serial output (SO). Information is input to a device via the SI. The information is output from the device via the SO. The SO of an earlier device in the daisy chain cascade is coupled to the SI of a device later in the daisy chain cascade. Information input to the earlier device via the device's SI is passed through the device and output from the device via the device's SO. The information is then transferred to the later device's SI via the connection from the earlier device's SO and the later device's SI.

50 Claims, 15 Drawing Sheets

(51) Int. Cl.
  *G06F 13/42*  (2006.01)
  *G11C 5/06*   (2006.01)
  *G06F 12/06*  (2006.01)
  *G11C 16/06*  (2006.01)

(56) References Cited

U.S. PATENT DOCUMENTS

| | | |
|---|---|---|
| 4,617,566 A | 10/1986 | Diamond |
| 4,683,555 A | 7/1987 | Pinkham |
| 4,733,376 A | 3/1988 | Ogawa |
| 4,796,231 A | 1/1989 | Pinkham |
| 4,899,316 A | 2/1990 | Nagami |
| 5,038,299 A | 8/1991 | Maeda |
| 5,126,808 A | 6/1992 | Montalvo et al. |
| 5,132,635 A | 7/1992 | Kennedy |
| 5,136,292 A | 8/1992 | Ishida |
| 5,175,819 A | 12/1992 | Le Ngoc et al. |
| 5,204,669 A | 4/1993 | Dorfe et al. |
| 5,243,703 A | 9/1993 | Farmwald et al. |
| 5,249,270 A | 9/1993 | Stewart et al. |
| 5,280,539 A | 1/1994 | Yeom et al. |
| 5,319,598 A | 6/1994 | Aralis et al. |
| 5,336,951 A | 8/1994 | Josephson et al. |
| 5,365,484 A | 11/1994 | Cleveland et al. |
| 5,386,511 A | 1/1995 | Murata et al. |
| 5,404,460 A | 4/1995 | Thomsen et al. |
| 5,430,859 A | 7/1995 | Norman |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,475,854 A | 12/1995 | Thomsen et al. |
| 5,519,847 A | 5/1996 | Fandrich et al. |
| 5,596,724 A | 1/1997 | Mullins et al. |
| 5,602,780 A | 2/1997 | Diem et al. |
| 5,636,342 A | 6/1997 | Jeffries |
| 5,663,901 A | 9/1997 | Wallace et al. |
| 5,671,178 A | 9/1997 | Park et al. |
| 5,721,840 A | 2/1998 | Soga |
| 5,729,683 A | 3/1998 | Le et al. |
| 5,740,379 A | 4/1998 | Hartwig |
| 5,761,146 A | 6/1998 | Yoo et al. |
| 5,768,212 A | 6/1998 | Fujita |
| 5,771,199 A | 6/1998 | Lee |
| 5,778,419 A | 7/1998 | Hansen |
| 5,802,006 A | 9/1998 | Ohta |
| 5,802,399 A | 9/1998 | Yumoto et al. |
| 5,806,070 A | 9/1998 | Norman et al. |
| 5,809,070 A | 9/1998 | Krishnan |
| 5,812,796 A | 9/1998 | Broedner et al. |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,872,994 A | 2/1999 | Akiyama et al. |
| 5,878,240 A | 3/1999 | Tomko |
| 5,896,400 A | 4/1999 | Roohparvar et al. |
| 5,900,021 A | 5/1999 | Tiede et al. |
| 5,937,425 A | 8/1999 | Ban |
| 5,938,750 A | 8/1999 | Shaberman |
| 5,941,974 A | 8/1999 | Babin |
| 5,959,930 A | 9/1999 | Sakurai |
| 5,964,857 A | 10/1999 | Srinivasan et al. |
| 5,966,723 A | 10/1999 | James et al. |
| 5,995,417 A | 11/1999 | Chen et al. |
| 6,002,638 A | 12/1999 | John |
| 6,085,290 A | 7/2000 | Smith et al. |
| 6,091,660 A | 7/2000 | Sasaki et al. |
| 6,097,666 A | 8/2000 | Sakui et al. |
| 6,102,963 A | 8/2000 | Agrawal |
| 6,107,658 A | 8/2000 | Itoh et al. |
| 6,144,576 A | 11/2000 | Leddige et al. |
| 6,144,579 A | 11/2000 | Taira |
| 6,148,363 A | 11/2000 | Lofgren et al. |
| 6,148,364 A | 11/2000 | Srinivasan et al. |
| 6,178,135 B1 | 1/2001 | Kang |
| 6,282,121 B1 | 8/2001 | Cho et al. |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,377,487 B1 | 4/2002 | Lee |
| 6,377,502 B1 | 4/2002 | Honda et al. |
| 6,378,018 B1 | 4/2002 | Tsern et al. |
| 6,422,098 B1 | 7/2002 | Hanson et al. |
| 6,438,064 B2 | 8/2002 | Ooishi |
| 6,442,098 B1 | 8/2002 | Kengeri |
| 6,453,365 B1 | 9/2002 | Habot |
| 6,510,086 B2 | 1/2003 | Kato et al. |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,509 B1 | 12/2003 | Bonella et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,718,432 B1 | 4/2004 | Srinivasan |
| 6,727,831 B2 | 4/2004 | Iwata |
| 6,732,221 B2 | 5/2004 | Ban |
| 6,754,807 B1 | 6/2004 | Parthasarathy et al. |
| 6,763,426 B1 | 7/2004 | James et al. |
| 6,792,003 B1 | 9/2004 | Polluri et al. |
| 6,792,033 B1 | 9/2004 | Maruta |
| 6,799,235 B2 | 9/2004 | Bormann et al. |
| 6,807,103 B2 | 10/2004 | Cavaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,906,978 B2 | 6/2005 | Elzur et al. |
| 6,928,002 B2 | 8/2005 | Shiga et al. |
| 6,928,501 B2 | 8/2005 | Andreas et al. |
| 6,944,093 B2 | 9/2005 | Sumitani |
| 6,944,697 B2 | 9/2005 | Andreas |
| 6,950,325 B1 | 9/2005 | Chen |
| 6,965,539 B2 | 11/2005 | Lee |
| 6,967,874 B2 | 11/2005 | Hosono |
| 6,996,644 B2 | 2/2006 | Schoch et al. |
| 7,020,757 B2 * | 3/2006 | Ruhovets et al. ............ 711/167 |
| 7,031,221 B2 | 4/2006 | Mooney et al. |
| 7,073,022 B2 | 7/2006 | El-Batal et al. |
| 7,111,140 B2 | 9/2006 | Estakhri et al. |
| 7,130,958 B2 | 10/2006 | Chou et al. |
| 7,202,545 B2 * | 4/2007 | Perner ......................... 257/499 |
| 7,242,635 B2 | 7/2007 | Okuda |
| 7,277,973 B2 | 10/2007 | Bando |
| 7,284,089 B2 | 10/2007 | Gallivan |
| 7,308,524 B2 | 12/2007 | Grundy et al. |
| 7,334,070 B2 | 2/2008 | Borkenhagen |
| 7,414,917 B2 * | 8/2008 | Ruckerbauer et al. ... 365/233.13 |
| 7,433,258 B2 | 10/2008 | Rao et al. |
| 7,652,922 B2 | 1/2010 | Kim et al. |
| 7,908,451 B2 * | 3/2011 | Larson ......................... 711/167 |
| 2002/0188781 A1 | 12/2002 | Schoch et al. |
| 2003/0074505 A1 | 4/2003 | Andreas et al. |
| 2003/0123473 A1 | 7/2003 | Satoh et al. |
| 2003/0128702 A1 | 7/2003 | Satoh et al. |
| 2003/0167374 A1 | 9/2003 | Hronik |
| 2003/0174075 A1 | 9/2003 | Iwata |
| 2003/0221061 A1 | 11/2003 | El-batal et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0148482 A1 * | 7/2004 | Grundy et al. ................ 711/167 |
| 2004/0199721 A1 | 10/2004 | Chen |
| 2004/0230738 A1 | 11/2004 | Lim et al. |
| 2005/0086413 A1 | 4/2005 | Lee et al. |
| 2005/0097249 A1 | 5/2005 | Oberlin et al. |
| 2005/0108469 A1 | 5/2005 | Freeman et al. |
| 2005/0120163 A1 * | 6/2005 | Chou et al. .................... 711/103 |

(56) References Cited

U.S. PATENT DOCUMENTS

| | | |
|---|---|---|
| 2005/0138267 A1* | 6/2005 | Bains et al. ............... 711/100 |
| 2005/0160218 A1 | 7/2005 | See et al. |
| 2005/0166006 A1 | 7/2005 | Talbot et al. |
| 2005/0213421 A1 | 9/2005 | Polizzi et al. |
| 2005/0273539 A1 | 12/2005 | Yamamoto |
| 2006/0020740 A1* | 1/2006 | Bartley et al. ............. 711/100 |
| 2006/0031593 A1 | 2/2006 | Sinclair |
| 2006/0041730 A1* | 2/2006 | Larson ...................... 711/167 |
| 2006/0044872 A1* | 3/2006 | Nazarian ............... 365/185.17 |
| 2006/0050594 A1 | 3/2006 | Park |
| 2006/0133160 A1* | 6/2006 | Dickin et al. .......... 365/189.05 |
| 2006/0198202 A1 | 9/2006 | Erez |
| 2006/0285424 A1* | 12/2006 | Gregorius et al. ........... 365/233 |
| 2007/0005831 A1* | 1/2007 | Gregorius .................... 710/52 |
| 2007/0076479 A1 | 4/2007 | Kim et al. |
| 2007/0083701 A1 | 4/2007 | Kapil |
| 2007/0153576 A1 | 7/2007 | Oh et al. |
| 2007/0234071 A1 | 10/2007 | Pyeon |
| 2008/0028175 A1* | 1/2008 | Bartley et al. ............. 711/167 |
| 2008/0028176 A1 | 1/2008 | Bartley et al. |
| 2008/0049505 A1* | 2/2008 | Kim et al. .............. 365/185.11 |
| 2008/0086590 A1* | 4/2008 | Urabe ........................ 711/103 |
| 2008/0144411 A1* | 6/2008 | Tsern .......................... 365/200 |
| 2008/0279003 A1 | 11/2008 | Kim et al. |

FOREIGN PATENT DOCUMENTS

| | | |
|---|---|---|
| EP | 1049021 A2 | 11/2000 |
| EP | 1425635 | 7/2001 |
| EP | 1457993 | 9/2004 |
| EP | 1457993 A2 | 9/2004 |
| EP | 1425635 B1 | 12/2006 |
| JP | S61-034654 | 2/1986 |
| JP | S61-048060 | 3/1986 |
| JP | S61-21600 | 9/1986 |
| JP | H01-076143 | 3/1989 |
| JP | 01200447 | 8/1989 |
| JP | 02136945 | 5/1990 |
| JP | H02-282989 | 11/1990 |
| JP | H03-113555 | 5/1991 |
| JP | 05108547 | 4/1993 |
| JP | H05-233524 | 9/1993 |
| JP | H05-241946 | 9/1993 |
| JP | H07-254292 | 10/1995 |
| JP | 07319755 | 12/1995 |
| JP | 08221319 | 8/1996 |
| JP | H09-054751 | 2/1997 |
| JP | H09-115286 | 5/1997 |
| JP | 09186584 | 7/1997 |
| JP | 1097464 | 4/1998 |
| JP | H10-116064 | 5/1998 |
| JP | 2000293432 | 10/2000 |
| JP | 2000-315185 | 11/2000 |
| JP | 2000315185 | 11/2000 |
| JP | 2001-5776 | 1/2001 |
| JP | H01-076143 | 3/2001 |
| JP | 2001-156621 | 6/2001 |
| JP | 2002-024158 | 1/2002 |
| JP | 2002109884 | 4/2002 |
| JP | 2002133867 | 5/2002 |
| JP | 2002236611 | 8/2002 |
| JP | 2003036681 | 2/2003 |
| JP | 2003-72276 | 3/2003 |
| JP | 2003-077276 | 3/2003 |
| JP | H03-113555 | 4/2003 |
| JP | 2003-198356 | 7/2003 |
| JP | 2003263363 | 9/2003 |
| JP | 2003-337640 | 11/2003 |
| JP | 2004-139364 | 5/2004 |
| JP | 2004242332 | 8/2004 |
| JP | 2005004895 | 1/2005 |
| JP | 2005025473 | 1/2005 |
| JP | 2005-078523 | 3/2005 |
| JP | 2005-196739 | 7/2005 |
| JP | H05-233524 | 9/2005 |
| JP | 2006260127 | 9/2006 |
| JP | 2007534044 | 11/2007 |
| JP | H09-054751 | 3/2009 |
| WO | WO 01/69411 A2 | 9/2001 |
| WO | 03010939 | 2/2003 |
| WO | 2005069150 | 7/2005 |
| WO | 2005069150 A1 | 7/2005 |
| WO | 2006017725 | 2/2006 |
| WO | 2006023360 | 3/2006 |
| WO | 2007003370 | 1/2007 |
| WO | 2007083701 | 7/2007 |
| WO | 2005038660 | 4/2011 |

OTHER PUBLICATIONS

"Intel® Advanced+ Boot Block Flash Memory (C3)", May 2005, Intel Corporation, pp. 1-72.

"256 M × 8 Bit/ 128M × 16 Bit/ 512M × 8 Bit NAND Flash Memory", K9K4GO8U1M, K9F2GO8UOM, K9F2G16U0M, Rev. 1.0, Samsung Electronics Co., Ltd., May 6, 2005, pp. 1-41.

King, et al., "Communicating with Daisy Chained MCP42XXX Digital Potentiometers", Microchip AN747, pp. 1-8, 2001.

"High Speed Small Sectored SPI Flash Memory," Atmel Corp., pp. 1-22 (2006).

64 Megabit CMOS 3.0 Volt Flash Memory with 50MHz SPI (2006).

"DiskOnChip H1 4Gb (512MByte) and 8 Gb (1 GByte) High Capacity Flash Disk with NAND and x2 Technology," Data Sheet, Rev. 0.5 (Preliminary), M-Systems Flash Disk Pioneers Ltd., pp. 1-66, (2005).

Tal, A., "Guidelines for Integrating DiskOnChip in a Host System," AP-DOC-1004, Rev. 1.0, M-Systems Flash Disk Pioneers Ltd., pp. 1-15, (2004).

OneNAND4G(KFW4G16Q2M-DEB6), OneNAND2G(KFH2G16Q2M-DEB6), OneNAND1G(KFWIG16Q2M-DEB6) Flash Memory, OneNAND™ Specification Ver. 1.2, Samsung Electronics, pp. 1-125, (Dec. 23, 2005).

Kennedy, J., et al., "A 2Gb/s Point-to-Point Heterogeneous Voltage Capable DRAM Interface for Capacity-Scalable Memory Subsystems," *ISSCC 2004/Session 1/DRAM/11.8*, IEEE International Solid-State Circuits Conference (2004).

Kim, Jae-Kwan, et al., "A 3.6Gb/s/pin Simultaneous Bidirectional (SBD) I/O Interface for High-Speed DRAM", *ISSCC 2004/SESSION 22/DSL and MULTI-Gb/s I/O 22.7*, IEEE International Solid-State Circuits Conference (2004).

"HyperTransport TM I/O Link Specification", Revision 2.00, Document No. HTC20031217-0036-00, HyperTransportTM Technology Consortium, pp. 1-325 (2001).

"IEEE Standard for High-Bandwidth Memory Interface Based on Scalable Coherent Interface (SCI) Signaling Technology (RamLink)", *IEEE Std. 1596-4-1996*, The Institute of Electrical Electronics Engineers, Inc., pp. i-91, (Mar. 1996).

"High-Speed Memory Architectures for Multimedia Applications",*Circuits & Devices*, IEEE 8755-3996/97/, pp. 8-13, Jan. 1997.

Gjessing, S., et al., "RamLink: A High-Bandwidth Point-to-Point Memory Architecture", IEEE 08186-2655-0/92, pp. 328-331, 1992.

Gjessing, S., et al., "Performance of the RamLink Memory Architecture", *Proceedings of the Twenty-Seventh Annual Hawaii International Conference on System Sciences*, IEEE 1060-3425/94, pp. 154-162, 1994.

Gjessing, S., et al., "A RAM link for high speed", *Special Report/Memory*, IEEE Spectrum, pp. 52-53, (Oct. 1992).

Diamond, S. L., "SyncLink: High-speed DRAM for the future", *Micro Standards*, IEEE Micro, pp. 74-75, (Dec. 1996).

"DDR2 Fully Buffered DIMM 240pin FBDIMMS based on 512Mb C-die", Rev. 1.3 Sep. 2006, Samsung Electronics, pp. 1-32 (Sep. 2006).

"HyperTransportTM IO Link Specification", Revision 3.00, Document No. HTC20051222-0046-0008, HyperTransport Technology Consortium, pp. 1-428, (Apr. 2006).

Extended European Search Report for European Patent Application No. 08006224.3, dated Sep. 16, 2008.

(56) References Cited

OTHER PUBLICATIONS

Extended European Search Report for European Patent Application No. 08006225.0, dated Sep. 16, 2008.
Extended European Search Report for European Patent Application No. 06790771.7, dated Sep. 16, 2008.
Extended European Search Report for European Patent Application No. 08006223.5, dated Sep. 16, 2008.
"Mbit, Low Voltage, Serial Flash Memory With 40MHz SPI Bus Interface", Silicon Storage Technology, Aug. 2005, pp. 1-40.
"The I2C-Bus Specification," Version 2.1, Philips Semiconductors, Jan. 2000, pp. 1-46.
Atmel, "8-megabit 2.5-volt Only or 2.7-volt Only DataFlash®," Technical Specification, Atmel, Rev. 2225H-DFLSH (2004).
Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.
Kim, et al. "A 120-mm2 64-Mb NAND Flash Memory Archieving 180 ns/Byte Effective Program Speed," IEEE Journal of Solid-State Circuits, vol. 32, No. 5, May 1977, pp. 670-680.
U.S. Appl. No. 11/496,278 Office Action dated Jul. 31, 2006.
U.S. Appl. No. 11/496,278, Office Action dated Feb. 18, 2010.
European Patent Application No. 06790770.9 Search Report dated Sep. 16, 2008.
European Patent Application No. 06790771.7: Office Action Dated Feb. 19, 2009.

\* cited by examiner

DAISY CHAIN CASCADING DEVICES

RELATED APPLICATIONS

This application is a continuation-in-part of U.S. application Ser. No. 11/496,278 filed Jul. 31, 2006, which is a continuation-in-part of U.S. patent application Ser. No. 11/324,023 filed Dec. 30, 2005, now U.S. Pat. No. 7,652,922 which claims the benefit of U.S. Provisional Application No. 60/722,368 filed on Sep. 30, 2005, and this application claims the benefit of U.S. Provisional Application No. 60/787,710 filed on Mar. 28, 2006. The entire teachings of the above applications are incorporated herein by reference.

BACKGROUND OF THE INVENTION

Today computer-based systems can be found most everywhere and have made inroads into many devices that are used by society everyday, such as cell phones, handheld computers, automobiles, medical devices, personal computers and so on. In general, society has placed much reliance on computer-based systems to handle everyday tasks such as simple tasks like balancing checkbooks to relatively complex tasks such as predicting the weather. As technology improves, more and more tasks are migrated to computer-based systems. This, in turn, causes society to become more and more reliant on these systems.

A typical computer-based system comprises a system board and optionally one or more peripheral devices, such as display units, storage units and the like. The system board may contain one or more processors, a memory subsystem and other logic, such as serial device interfaces, network device controllers, hard disk controllers and the like.

The type of processors that are employed on a particular system board usually depends on the type of tasks performed by the system. For example, a system that performs a limited set of tasks, such as monitor emissions generated by an automobile engine and adjust an air/fuel mixture to ensure the engine is burning fuel completely may employ a simple specialized processor that is tailored to performing these tasks. On the other hand, a system that performs many different tasks, such as managing many users and running many different applications, may employ one or more complex processors that are general purpose in nature, configured to perform high-speed calculations and manipulate data to minimize the response time to servicing the users' requests.

The memory subsystem is a storage that holds information (e.g., instructions, data values) used by the processors. The memory subsystem typically comprises controller logic and one or more memory devices. The controller logic typically is configured to interface the memory devices with the processors and enable the processors to store and retrieve information to and from the memory devices. The memory devices hold the actual information.

Like the processors, the type of devices employed in a memory subsystem is often driven by the type of tasks performed by the computer system. For example, a computer system may have the task of having to boot without the assistance of a disk drive and execute a set of software routines that do not change often. Here, the memory subsystem may employ non-volatile devices, such as flash memory devices, to store the software routines. Other computer systems may execute very complex tasks that require a large high-speed data store to hold large portions of information. Here, the memory subsystem may employ high-speed high-density Dynamic Random Access Memory (DRAM) devices to store large portions of information.

Presently, hard disk drives have high densities that can store 20 to 40 Gigabytes of data, but are relatively bulky. However, flash memory, also known as solid-state drive, is popular because of its high density, non-volatility, and small size relative to hard disk drives. Flash memory technology is based on EPROM and EEPROM technologies. The term "flash" was chosen because a large number of memory cells could be erased at one time as distinguished from EEPROMs, where each byte was erased individually. The advent of multi-level cells (MLC) further increases Flash memory density relative to single level cells. Those of skill in the art will understand that Flash memory can be configured as NOR Flash or NAND Flash, with NAND Flash having higher density per given area due to its more compact memory array structure. For the purpose of further discussion, references to Flash memory should be understood as being either NOR or NAND or other type Flash memory.

Devices in a memory subsystem are often interconnected using a parallel interconnection scheme. This scheme involves interconnecting the devices in a manner such that address and data information and control signals are coupled to the devices in a parallel fashion. Each device may incorporate multiple inputs/outputs to accommodate the parallel transfer of the data and address information as well as control signals to the devices.

SUMMARY OF THE INVENTION

One shortcoming associated with utilizing parallel interconnections in a memory subsystem is that they tend to require a large number of interconnections between the devices in order to transfer information and signals to the devices in parallel. This adds to the complexity of boards that implement these subsystems. Moreover, undesirable effects associated with large numbers of interconnections, such as crosstalk, tend to limit the performance of these subsystems. In addition, the number of devices incorporated in these subsystems may be limited due to propagation delay of signals carried by the interconnections.

The techniques described herein overcome the above shortcomings by providing a technique for coupling devices in a serial daisy chain cascading arrangement that employs fewer and shorter connections than parallel interconnection implementations. Configuring devices in the daisy chain arrangement may allow the devices to be operated at higher speeds than parallel interconnection implementations because utilizing fewer and shorter interconnections makes the overall implementation less vulnerable to undesirable effects, such as propagation delay and crosstalk. Moreover, fewer and shorter connections tend to reduce the complexity of the implementation. This reduced complexity further enables a subsystem containing the devices to be implemented in a smaller area thus allowing the subsystem to occupy a smaller footprint.

According to aspects of the techniques described herein, devices are coupled in a daisy chain cascade arrangement such that outputs of an earlier device in the daisy chain cascade are coupled to inputs of the next device later in the daisy chain to accommodate the transfer of information (e.g., data, address and command information) and control signals (e.g., enable signals) from the earlier device to the latter device.

In an embodiment of the techniques, each device in the daisy chain cascade comprises a serial input (SI) and a serial output (SO). Information is input to a device via its SI. Likewise, the information is output from the device via its SO. The SO of a device in the daisy chain cascade is coupled to the SI of the next device in the daisy chain cascade. Circuitry is provided in the devices to enable information input to an earlier device in the daisy chain cascade via its SI to be passed through the device and output from the device via its SO. The information is then transferred to the SI of the next device in the daisy chain cascade via the connection between the earlier device's SO and the next device's SI. The transferred information may then be inputted to the next device via its SI.

In addition, a clock signal is coupled to the devices in the daisy chain cascade. The clock signal is used by the devices to accommodate the transfer of the information from one device to the next device in the daisy chain cascade.

In accordance with other aspects of the techniques described herein, control signals (e.g., enable signals) that are utilized by the devices to, e.g., enable data to be input to the device via the SI and output from the device via the SO are transferred between devices in the daisy chain cascade, as described above. Here, circuitry is provided to enable control signals input to an earlier device in the daisy chain cascade to be propagated through the device and transferred from the device via an output to an input of a next device in the daisy chain cascade. The transferred control signals are then input to the next device via the input.

According to principles of the present invention, a flash memory system may have plurality of serially connected flash memory devices. A flash memory device of the system may include a serial data link interface having a serial input data port and a serial data output port, a control input port for receiving a first input enable signal, and a control output port for sending a second input enable signal. The input enable signals are used in circuitry that controls data transfer between the serial data link interface and the memory bank. The flash memory devices are configured to receive serial input data and control signals from an external source and to provide data and control signals to an external device. The external source and external device may be other flash memory devices within the system. In embodiment of the present invention, when devices are serially cascaded in a system, they may further output control ports that "echo" the received IPE and OPE signals to external devices. This allows the system to have point-to-point connected signal ports to form a daisy-chain cascading scheme (versus broadcasting/multi-drop cascading scheme).

These systems may use a unique device identification and target device selection address scheme, rather than using limited hardware physical device select pins, so that the whole system can be easily expanded as many as possible in terms of memory density without sacrificing system's overall performance. In some embodiments of the present invention, each of the flash memory devices may include a unique device identifier. The devices may be configured parse a target device information field in serial input data to correlate target device information with the unique device identification number of the device to determine whether the device is the target device. The device may parse the target device information field prior to processing any additional input data received. If the memory device is not the target device, it may ignore the serial input data, thus saving additional processing time and resources.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of preferred embodiments of the invention follows.

Figure 1:
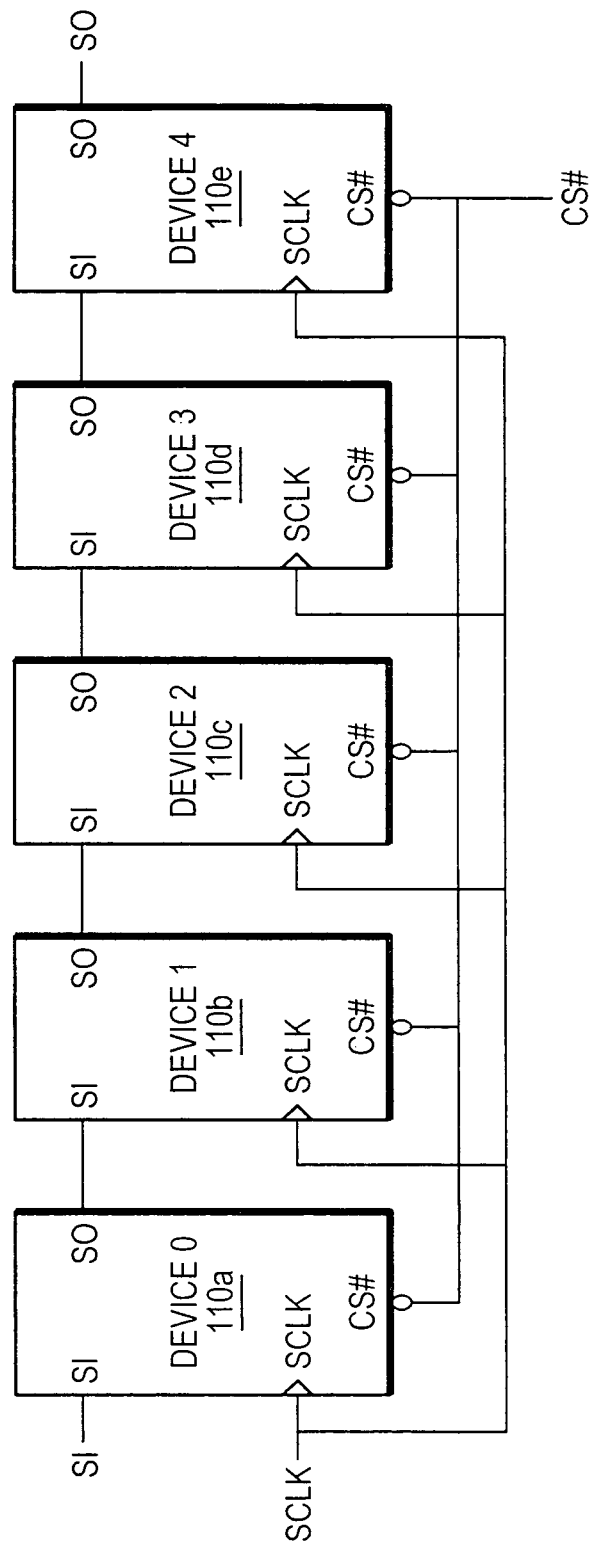
FIG. 1 is a block diagram of an exemplary device configuration comprising a plurality of single port devices configured in a serial daisy chain cascade arrangement.

FIG. 1 is a block diagram of an exemplary device configuration comprising a plurality of single port devices 110*a-e* configured in a serial daisy chain cascade arrangement. The devices 110*a-e* are illustratively memory devices each of which contains a memory (not shown) which may comprise Dynamic Random Access Memory (DRAM) cells, Static Random Access Memory (SRAM) cells, flash memory cells and the like. Each device 110 comprises a serial input (SI), a serial output (SO), a clock (SCLK) input and a chip select (CS#) input.

The SI is used to transfer information (e.g., command, address and data information) into the device 110. The SO is used to transfer information from the device 110. The SCLK input is used to provide an external clock signal to the device 110 and the CS# input is used to provide a chip select signal to the device 110. An example of a device that may be used with the techniques described herein is a Multiple Independent Serial Link (MISL) Memory device described in previously incorporated U.S. patent application Ser. No. 11/324, 023.

The SI and SO are connected between devices 110 in the daisy chain cascade arrangement such that the SO of a device 110 earlier in the daisy chain cascade is coupled to the SI of the next device 110 in the daisy chain cascade. For example, the SO of device 110a is coupled to the SI of device 110b. The SCLK input of each device 110 is fed with a clock signal from, e.g., a memory controller (not shown). The clock signal is distributed to each device 110 via a common link. As will be described further below, SCLK is used to, inter alia, latch information input to the device 110 at various registers contained in the device 110.

Information input to the devices 110 may be latched at different times of the clock signal fed to the SCLK input. For example, in a single data rate (SDR) implementation, information input to the device 110 at the SI may be latched at either the rising or falling edge of the SCLK clock signal. Alternatively, in a double data rate (DDR) implementation, both the rising and falling edges of the SCLK clock signal may be used to latch information input at the SI.

The CS# input of each device is a conventional chip select that selects the device. This input is coupled to a common link which enables a chip select signal to be asserted to all of the devices 110 concurrently and consequently selects all of the devices 110 simultaneously.

Figure 2:
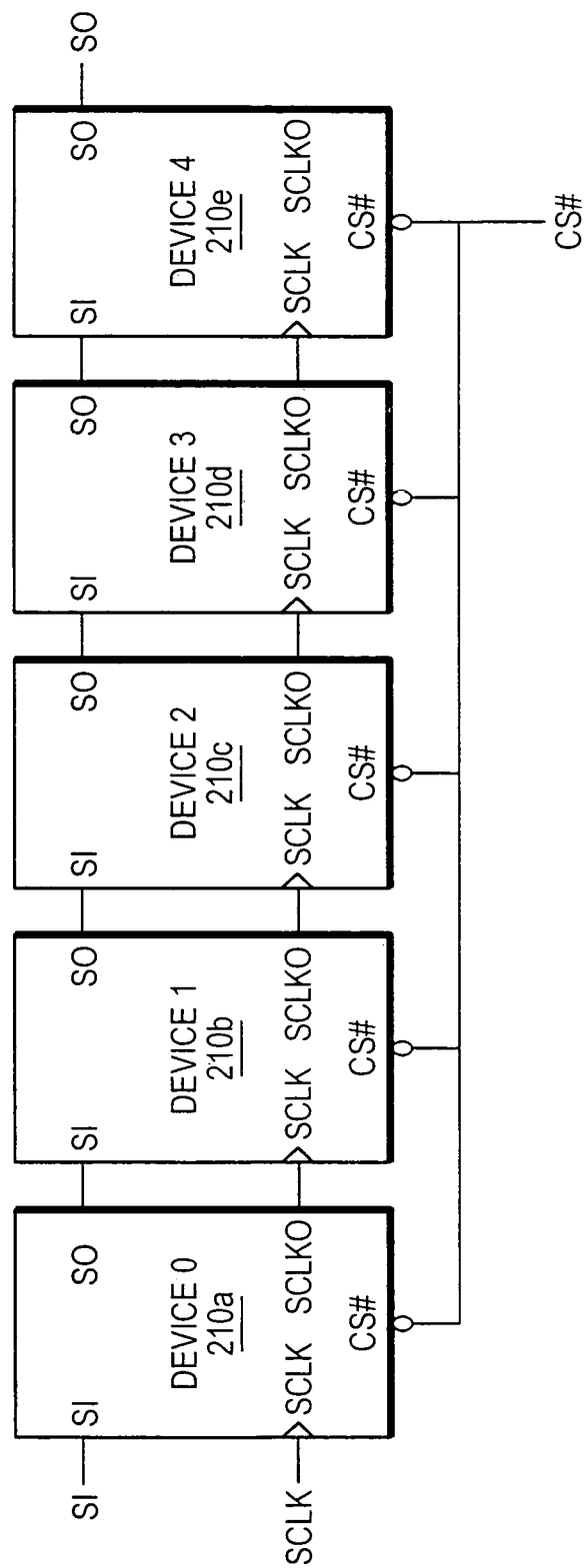
FIG. 2 is a block diagram of an exemplary device configuration comprising a plurality of single port devices configured in a serial daisy chain cascading arrangement having a cascaded clock.

FIG. 2 is a block diagram of an exemplary device configuration comprising a plurality of single port devices 210a-e configured in a serial daisy chain cascading arrangement having a cascaded clock. Each device 210 comprises a SI, SO, SCLK input and CS# input, as described above. In addition, each device 210 comprises a clock output (SCLKO). The SCLKO is an output that outputs the SCLK signal input to the device 210.

Referring to FIG. 2, the SI and SO of the devices 210 are coupled in a daisy chain cascade arrangement, as described above. In addition, the SCLK input and SCLKO of the devices are also coupled in a daisy chain cascade arrangement such that the SCLKO of an earlier device 210 in the daisy chain cascade is coupled to the SCLK input of the next 210 device in the daisy chain cascade. Thus, for example, the SCLKO of device 210a is coupled to the SCLK input of device 210b.

Note that the clock signal may incur a delay as it propagates through the daisy chain cascaded devices. An internal delay compensation circuit, such as a delay locked loop (DLL) circuit, may be employed to obviate this delay.

Figure 3:
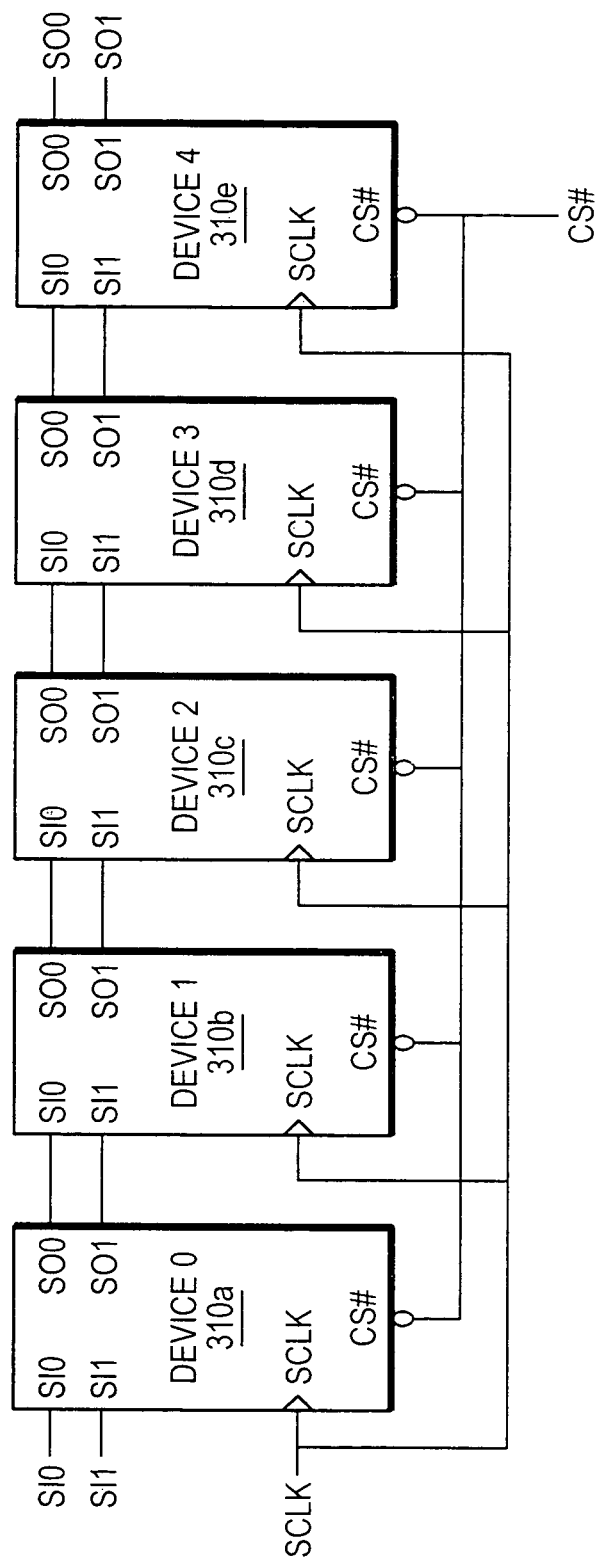
FIG. 3 is a block diagram of an exemplary device configuration comprising a plurality of dual port devices configured in a serial daisy chain cascade arrangement.

FIG. 3 is a block diagram of an exemplary device configuration comprising a plurality of dual port devices 310a-e configured in a serial daisy chain cascading arrangement. Each device 310 comprises an SI and SO for each port, an SCLK input and CS# input, as described above. Referring to FIG. 3, the SI for the first port on the device 310 is labeled "SI0" and the SI for the second port is labeled "SI1". Likewise, the SO for the first port is labeled "SO0" and for the second port "SO1". The SI and SO for each port are connected between devices 310 as described above. Thus, for example, the SO of port 0 on device 310a is fed to the SI of port 0 on device 310b and so on. Likewise, the SO of port 1 on device 310a is fed to the SI of port 1 on device 310b and so on.

Figure 4:
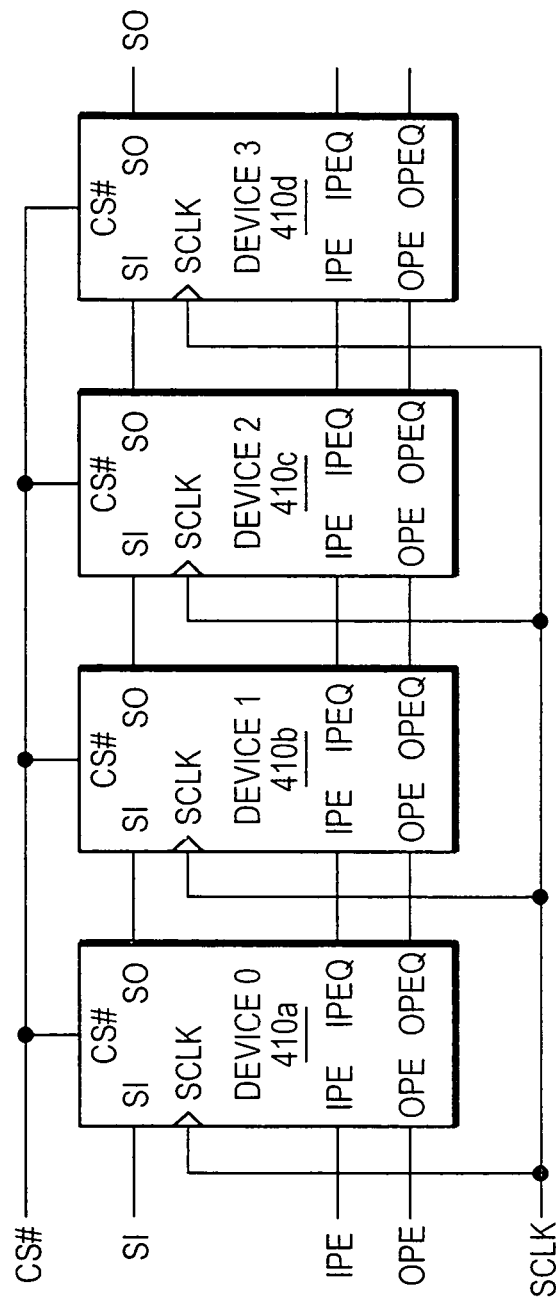
FIG. 4 is a block diagram of an exemplary device configuration comprising a plurality of single port devices configured in a serial daisy chain arrangement having inputs and outputs for various enable signals.

FIG. 4 is a block diagram of an exemplary device configuration comprising a plurality of single port devices configured in a serial daisy chain arrangement having inputs and outputs for various enable signals. Each device 410 comprises an SI, SO, CS# input, SCLK input, as described above. In addition, each device 410 comprises an input port enable (IPE) input, output port enable (OPE) input, input port enable output (IPEQ) and output port enable output (OPEQ). The IPE input is used to input an IPE signal to the device. The IPE signal is used by the device to enable the SI such that when IPE is asserted information may be serially input to the device 410 via the SI. Likewise, the OPE input is used to input an OPE signal to the device. The OPE signal is used by the device to enable the SO such that when OPE is asserted information may be serially output from the device 410 via the SO. The IPEQ and OPEQ are outputs that output the IPE and OPE signals, respectively, from the device. The IPEQ signal may be a delayed IPE signal, or some derivative of the IPE signal. Similarly, the OPEQ signal may be a delayed OPE signal, or some derivative of the OPE signal. The CS# input and SCLK inputs are coupled to separate links which distribute the CS# and SCLK signals, respectively, to the devices 410a-d, as described above.

The SI and SO are coupled from one device to the next in a daisy chain cascade arrangement, as described above. Moreover, the IPEQ and OPEQ of an earlier device 410 in the daisy chain cascade are coupled to the IPE input and OPE input, respectively, of the next device 410 in the daisy chain cascade. This arrangement allows IPE and OPE signals to be transferred from one device 410 to the next in a serial daisy chain cascade fashion.

Figure 5:
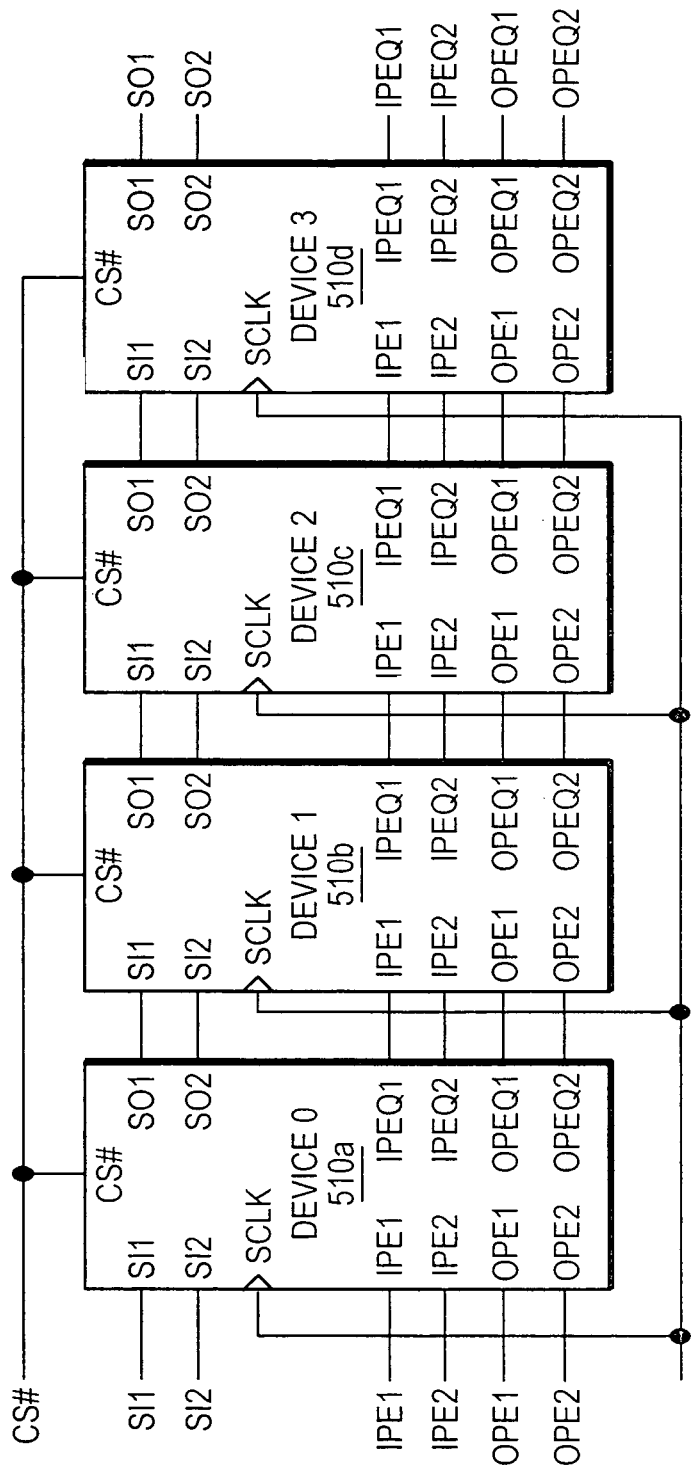
FIG. 5 is a block diagram of an exemplary device configuration comprising dual port devices configured in a serial daisy chain arrangement having inputs and outputs configured for various enable signals.

FIG. 5 is a block diagram of an exemplary device configuration comprising dual port devices 510a-d configured in a serial daisy chain arrangement having inputs and outputs for various enable signals. Each device 510 comprises a CS# input, SCLK input, and an SI, SO, IPE, OPE, IPEQ and OPEQ for each port, as described above. The SI, SO, IPE, OPE, IPEQ and OPEQ for port 1 and port 2 are designated SI1, SO1, IPE1, OPE1, IPEQ1 and OPEQ1, and SI2, SO2, IPE2, OPE2, IPEQ2 and OPEQ2, respectively.

The CS# input for each device 510 is coupled to a single link to simultaneously select all devices 510, as described above. Likewise, the SCLK for each device 510 is coupled to a single link which is configured to simultaneously distribute a clock signal to all devices 510, as described above. Also, as described above, the SI, SO, IPE, OPE, IPEQ and OPEQ are coupled between devices such that the SO, IPEQ and OPEQ of an earlier device in the daisy chain cascade are coupled to the SI, IPE and OPE of a later device in the daisy chain cascade. For example, the SO1, SO2, IPEQ1, IPEQ2, OPEQ1 and OPEQ2 of device 510a are coupled to the SI1, SI2, IPE1, IPE2, OPE1 and OPE2, respectively, of device 510b.

The SI, IPE and OPE signals that are input to the SI, IPE and OPE inputs of device 510a, respectively, are provided to the device 510a from, e.g., a memory controller (not shown). Device 510d provides data and control signals back to the memory controller via the SO, IPEQ and OPEQ outputs of device 510d.

Figure 6:
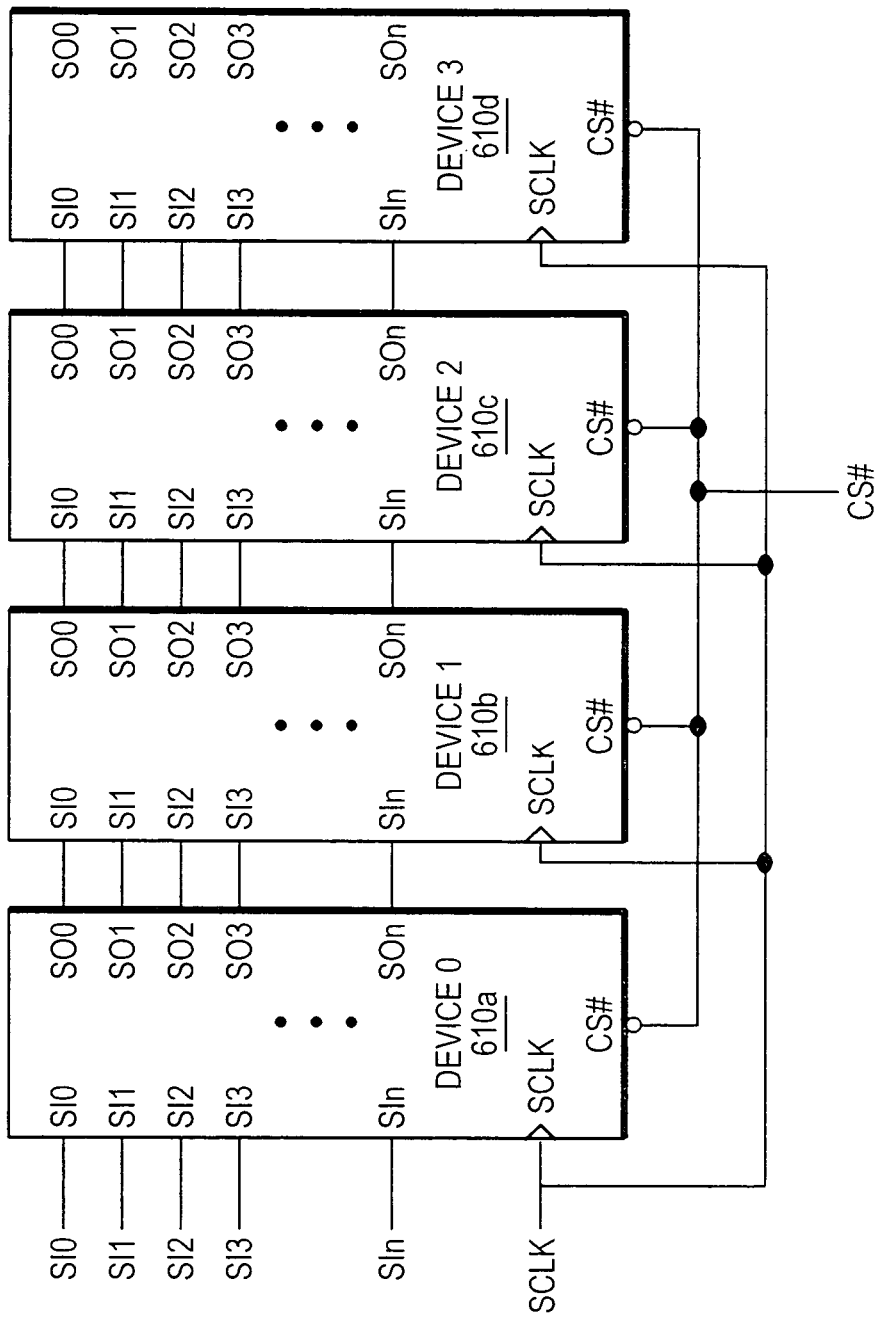
FIG. 6 is a block diagram of an exemplary device configuration comprising a plurality of devices having multiple serial inputs and multiple serial outputs which are configured in a serial daisy chain cascading arrangement.

FIG. 6 is a block diagram of an exemplary device configuration comprising a plurality of devices 610a-d having multiple serial inputs (SI0 to SIn) and multiple serial outputs (SO0 to SOn) which are configured in a serial daisy chain cascading arrangement. In addition, each device 610 has an SCLK input and CS# input, as described above.

The serial inputs (SI0 to SIn) and serial outputs (SO0 to SOn) employed for each device 610 enable information to be input to and output from the device 610, respectively, in a serial fashion. Each input may be assigned a specific role to input certain types of information (e.g., address, command, data) and/or signals (e.g., enable signals) to the device 610. Likewise, each output may be assigned a specific role to output certain types of information and signals from the device 610. For example, one or more inputs may be assigned a role to enable address information to be input to the device 610. Likewise, for example, one or more outputs may be assigned a role to output the address information from the device 610.

The number of serial inputs and serial outputs for each device 610 typically depends on certain factors, such as the number of address lines, command size and data width size. These factors may be influenced by how the device is used in a particular system application. For example, a system application that requires a data store that is used to store a small amount of information may employ a device that has fewer address and data lines, and hence fewer inputs/outputs, than a system application that requires a data store for a large amount of information.

Figure 7:
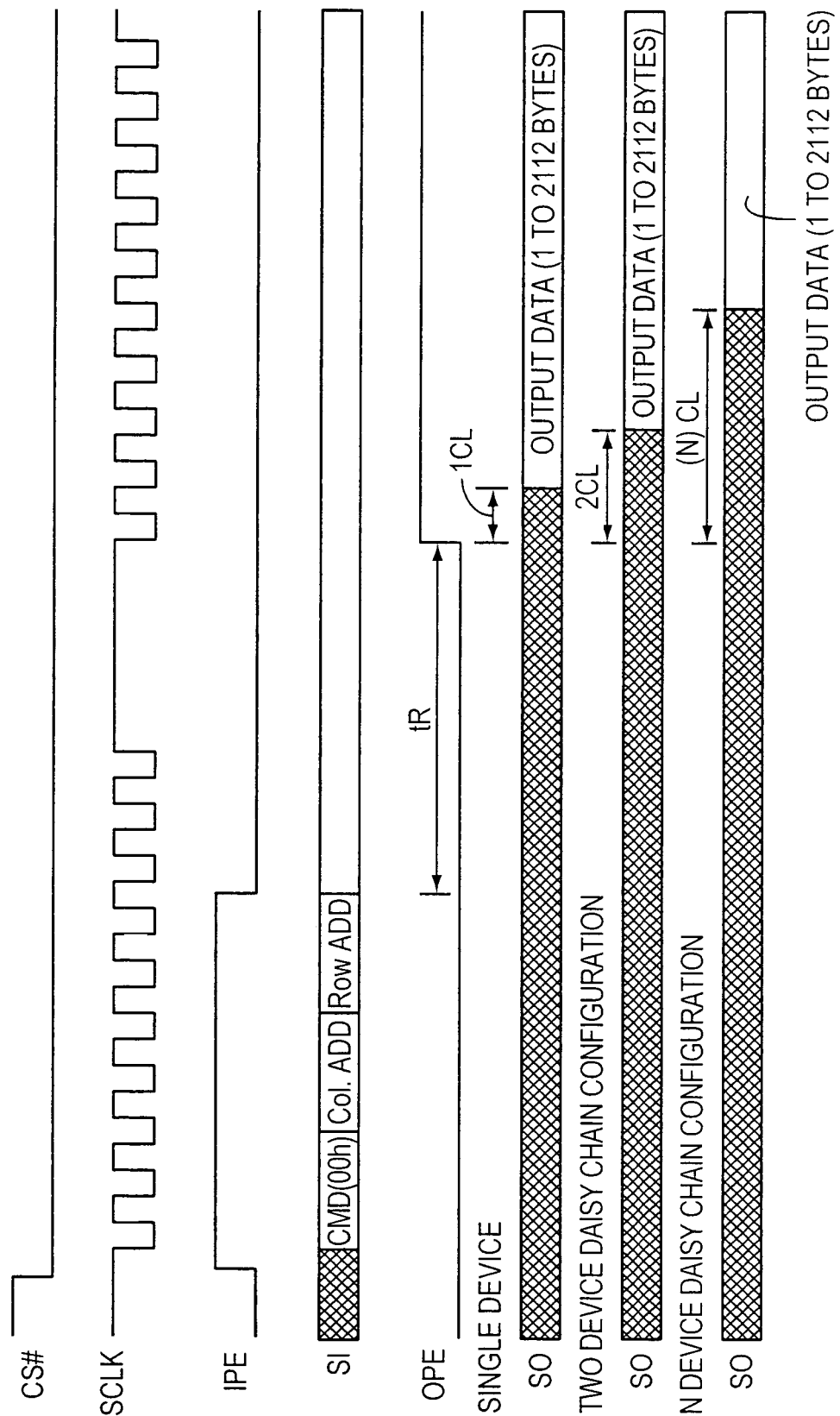
FIG. 7 is a timing diagram illustrating timing associated with a read operation performed on a single device configured and a plurality of devices configured in a serial daisy chain cascade arrangement.

FIG. 7 is a timing diagram illustrating timing associated with a read operation performed on a single device, and a plurality of devices configured in a serial daisy chain cascade arrangement. Referring to FIG. 7, CS# is asserted to select all of the devices. The read operation begins by asserting IPE and clocking information associated with the read operation into the device via SI. Illustratively, this information includes a command (CMD) indicating a read operation is to be performed and a column address (Col. ADD) and row address (Row ADD) that indicate a starting location in memory where the data is read.

At time "tR", the requested data is read from memory and placed in a special internal data buffer contained in the device. The length of tR is typically determined by characteristics of cells that comprise the memory. After time tR, OPE is asserted to enable the serial transfer of data from the internal data buffer via the SO to the next device in the daisy chain cascade. The data is serially outputted from the internal buffer at the SO output, illustratively, at the rising edge of SCLK. Data output from a device in the daisy chain cascade is delayed as much as one clock cycle to control latency, e.g., associated with propagating control signals, such as IPE and OPE. As will be described further below, latency control is performed using a clock synchronized latch.

Examples of some of the operations of cascaded memory devices in for a flash core architecture implementation are shown in Table I below. Table I lists the target device address (TDA), possible OP (operation) codes and corresponding states of the column address, row/bank address, and the input data.

TABLE 1

Command Set

| Operation | Target Device Address (1 Byte) | OP Code (1 Byte) | Column Address (2 Bytes) | Row/Bank Address (3 Bytes) | Input Data (1 Byte to 2112 Bytes) |
| --- | --- | --- | --- | --- | --- |
| Page Read | tda | 00h | Valid | Valid | — |
| Random Data Read | tda | 05h | Valid | — | — |
| Page Read for Copy | tda | 35h | — | Valid | — |
| Target Address Input for Copy | tda | 8Fh | — | Valid | — |
| Serial Data Input | tda | 80h | Valid | Valid | Valid |
| Random Data Input | tda | 85h | Valid | — | Valid |
| Page Program | tda | 10h | — | — | — |
| Block Erase | tda | 60h | — | Valid | — |
| Read Status | tda | 70h | — | — | — |
| Read ID | tda | 90h | — | — | — |
| Write Configuration Register | tda | A0h | — | — | Valid (1 Byte) |
| Write DN (Device Name) Entry | 00h | B0h | — | — | — |
| Reset | tda | FFh | — | — | — |
| Bank Select | tda | 20h | — | Valid (Bank) | — |

In some embodiments of the present invention, each device in system shown in FIGS. 1-6 may possess a unique device identifier that may be used as a target device address (tda) in the serial input data. When receiving the serial input data, a flash memory device may parse the target device address field in the serial input data, and determine whether the device is the target device by correlating the target device address with the unique device identification number of the device.

Table 2 shows a preferred input sequence of the input data stream in accordance with embodiments of the present invention, including the systems described in connection with FIGS. 1-6. The commands, addresses, and data are serially shifted in and out of each memory device, starting with the most significant bit.

Referring to FIG. 4, the devices 410a-d may operate with serial input signal (SIP) sampled at the rising edges of serial clock (SCLK) while Input Port Enable (IPE) is HIGH. Command sequences start with a one-byte target device address ("tda") and one-byte operation code, also referred interchangeably as a command code ("cmd" in Table 1). By starting the serial input signal with the one-byte target device address at the most significant bit, the device may parse the target device address field prior to processing any additional input data received. If the memory device is not the target device, it may transfer the serial input data to another device prior to processing, thus saving additional processing time and resources.

TABLE 2

| Operation | 1st Byte | 2nd Byte | 3rd Byte | 4th Byte | 5th Byte | 6th Byte | 7th Byte | 8th Byte | ... | 2116th Byte | ... | 2119th Byte |
|---|---|---|---|---|---|---|---|---|---|---|---|---|
| Page Read | tda | cmd | ca | ca | ra | ra | ra | — | | — | | — |
| Random Data Read | tda | cmd | ca | ca | — | — | — | — | | — | | — |
| Page Read for Copy | tda | cmd | ra | ra | ra | — | — | — | | — | | — |
| Target Address Input for Copy | tda | cmd | ra | ra | ra | — | — | — | | — | | — |
| Serial Data Input | tda | cmd | ca | ca | ra | ra | ra | data | ... | data | ... | data |
| Random Data Input | tda | cmd | ca | ca | data | data | data | data | ... | data | | — |
| Page Program | tda | cmd | — | — | — | — | — | — | | — | | — |
| Block Erase | tda | cmd | ra | ra | ra | — | — | — | | — | | — |
| Read Status | tda | cmd | — | — | — | — | — | — | | — | | — |
| Read ID | tda | cmd | — | — | — | — | — | — | | — | | — |
| Write Configuration Register | tda | cmd | data | — | — | — | — | — | | — | | — |
| Write DN Entry | tda | cmd | — | — | — | — | — | — | | — | | — |
| Reset | tda | cmd | — | — | — | — | — | — | | — | | — |

The 1-byte TDA is shifted into the device followed by the 1-byte cinb code. The most significant bit (MSB) starts on the SIP and each bit is latched at the rising edges of serial clock (SCLK). Depending on the command, the one-byte command code may be followed by column address bytes, row address bytes, bank address bytes, data bytes, and/or a combination or none.

Figure 8:
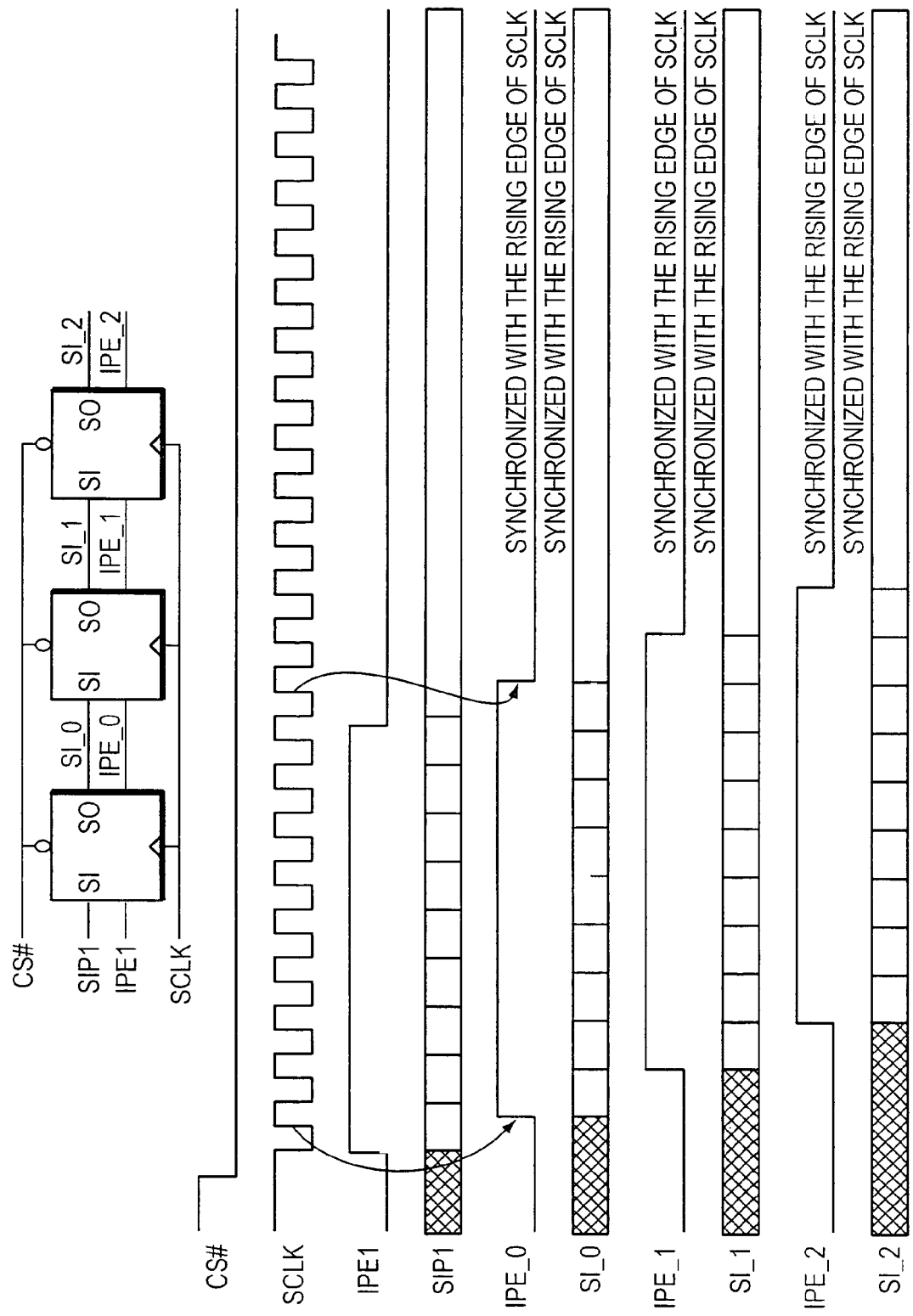
FIG. 8 is a timing diagram illustrating timing associated with information transferred between devices configured in a serial daisy chain cascade arrangement.

FIG. 8 is a timing diagram illustrating timing associated with information transferred between devices configured in a serial daisy chain cascade arrangement. As above, CS# is asserted to select the devices. Information is input to the first device in the daisy chain cascade by asserting IPE and clocking data into the device on successive rising edges of SCLK. IPE is propagated through the first device to the second device in less than a cycle. This enables information to be clocked from the SO of the first device into the SI of the second device at one cycle after the information was clocked into the first device. This is repeated for successive devices in the daisy chain cascade. Thus, for example, the information is inputted to the third device in the serial daisy chain cascade at the third rising edge of SCLK from the latch point of the data at the first device. Control signals IPE and OPE are synchronized with the rising edge of SCLK in order to ensure a proper setup time for these signals at the next device in the daisy chain cascade.

Figure 9:
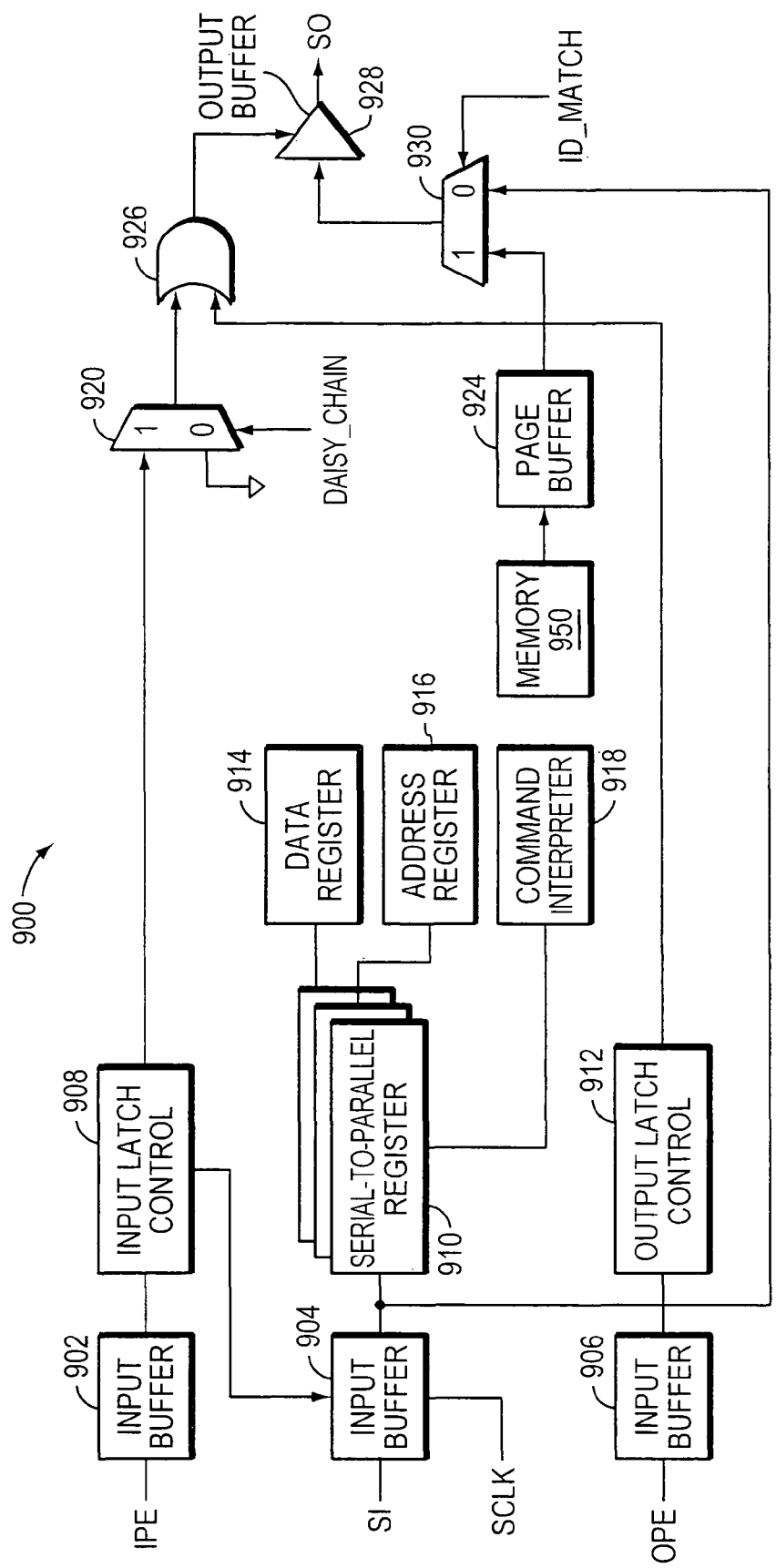
FIG. 9 is a high-level block diagram of exemplary serial output control logic for a single ported device.

FIG. 9 is a block diagram of exemplary serial output control logic 900 for a single ported device. Logic 900 comprises an input buffer for IPE 902, input buffer for SI (SIP) 904, input buffer for OPE 906, input latch control 908, serial-to-parallel register 910, output latch control 912, data register 914, address register 916, command interpreter 918, selector 920, page buffer 924, logical OR gate 926, output buffer 928, selector 930 and memory 950.

Input buffer 902 is a conventional low-voltage transistor-to-transistor logic (LVTTL) buffer configured to buffer the state of an IPE signal fed to the device at the input of buffer 902. The output of buffer 902 is fed to input latch control 908 which latches the state of the IPE signal and provides a latched state of the IPE signal to input buffer 904 and selector 920. Input buffer 904 is a LVTTL buffer configured to buffer information fed to the device via the SI input. Input buffer 904 is enabled by the output of input latch control 908. When enabled, information provided to the SI input is fed by the buffer 908 to the serial-to-parallel register 910 and an input of selector 930. The input buffer 904 is enabled when the latched state of the IPE signal fed from the input latch control 908 indicates that the IPE signal is asserted. Information fed to the serial-to-parallel register 910 is converted by the register 910 from a serial form to a parallel form. Outputs of the serial-to-parallel register 910 are fed to data register 914, address register 916 and command interpreter 918.

The data register 914 and address register 916 hold data and address information, respectively, that is fed to the device via the SI. The command interpreter 918 is configured to interpret commands input to the device via the SI. These commands are used to further control the operation of the device. For example, a "write memory" command may be used to cause the device to write data contained in the data register 914 to memory 950 contained in the device at an address specified by the address register 916.

The input buffer 906 is a LVTTL buffer configured to buffer an OPE signal that is fed to the OPE input of the device. The output of buffer 906 is transferred to an output latch control 912 which latches the state of the OPE signal. Output latch control outputs the latched OPE signal state to OR gate 926. OR gate 926 is a conventional logic OR gate whose output is used to enable/disable the output of output buffer 928.

Selector 920 is a conventional 2-to-1 multiplexer that outputs one of two inputs as selected by the signal DAISY_CHAIN. As noted above, one of these inputs is the latched state of IPE from input latch control 908. The other input is set to a logical low condition. The signal DAISY_CHAIN indicates whether the device is coupled to one or more other devices in a serial daisy chain cascade arrangement. Illustratively, this signal is asserted if the device is coupled to one or more devices in a serial daisy chain cascade arrangement. Asserting the DAISY_CHAIN signal causes the latched state of the IPE signal fed to the selector 920 to be output from the selector 920. When DAISY_CHAIN is not asserted, the logic low condition input to the selector 920 is output from the selector 920.

Page buffer 924 is a conventional data buffer that is configured to hold information read from memory 950. Selector 930 is a conventional 2-to-1 multiplexer that outputs one of two inputs as selected by the signal ID_MATCH. One input to selector 930 is fed from the output of the page buffer 924 and the other input is fed from the output of the SI input buffer 904. The output of selector 930 is fed to output buffer 928. The signal ID_MATCH indicates whether a particular command sent to the device via SI is addressed to the device. If the command is addressed to the device, ID_MATCH is asserted causing the output from the page buffer 924 to be output from the selector 930. If ID_MATCH is not asserted, the output from the SI buffer 904 (i.e., the state of the SI signal input to the device) is output from selector 930.

Memory 950 is a conventional memory configured to hold data. Memory 950 may be a random access memory (RAM) comprising cells, such as static RAM (SRAM), dynamic RAM (DRAM) or flash memory cells, that are addressable using an address that is input to the device via the SI.

Operationally, an asserted IPE signal is buffered by input buffer 902 and transferred to input latch control 908 which latches the asserted state of IPE. This latched state is fed to selector 920 and to input buffer 904 to enable this buffer 904. Command, address and data information input to input buffer 904 are then transferred to the serial-to-parallel register 910 which converts the information from a serial form to a parallel form and feeds the command, address and data information to the command interpreter 918, address register 916 and data register 914, respectively. The output of buffer 904 is also fed to selector 930. If ID_MATCH is not asserted, the output of the buffer 904 is present at the output of selector 930 which is fed to the input of output buffer 928. If DAISY_CHAIN is asserted, the latched state of IPE is present at the output of selector 920 and fed to a first input of OR gate 926. OR gate 926 passes the state of IPE to output buffer 928 to enable the output buffer 928. This, in turn, allows the information input to the SI input to be output from the device at SO.

Data from the page buffer 924 are output from the device by asserting OPE and ID_MATCH. Specifically, the asserted state of OPE is fed to input buffer 906 which in turn feeds the state to output latch control 912 which latches the state. The latched asserted state is fed to a second input of OR gate 926 which outputs a signal to enable output buffer 928. Asserting ID_MATCH enables the output of page buffer 924 to be present at the output of selector 930. The output of selector 930 is fed to the enabled output buffer 928 which outputs the data from the device at the device's SO output.

Note that, if DAISY_CHAIN is not asserted, output buffer 928 is only enabled by the OPE. This allows the device to be used in non-daisy chain serial cascade configurations.

Figure 10:
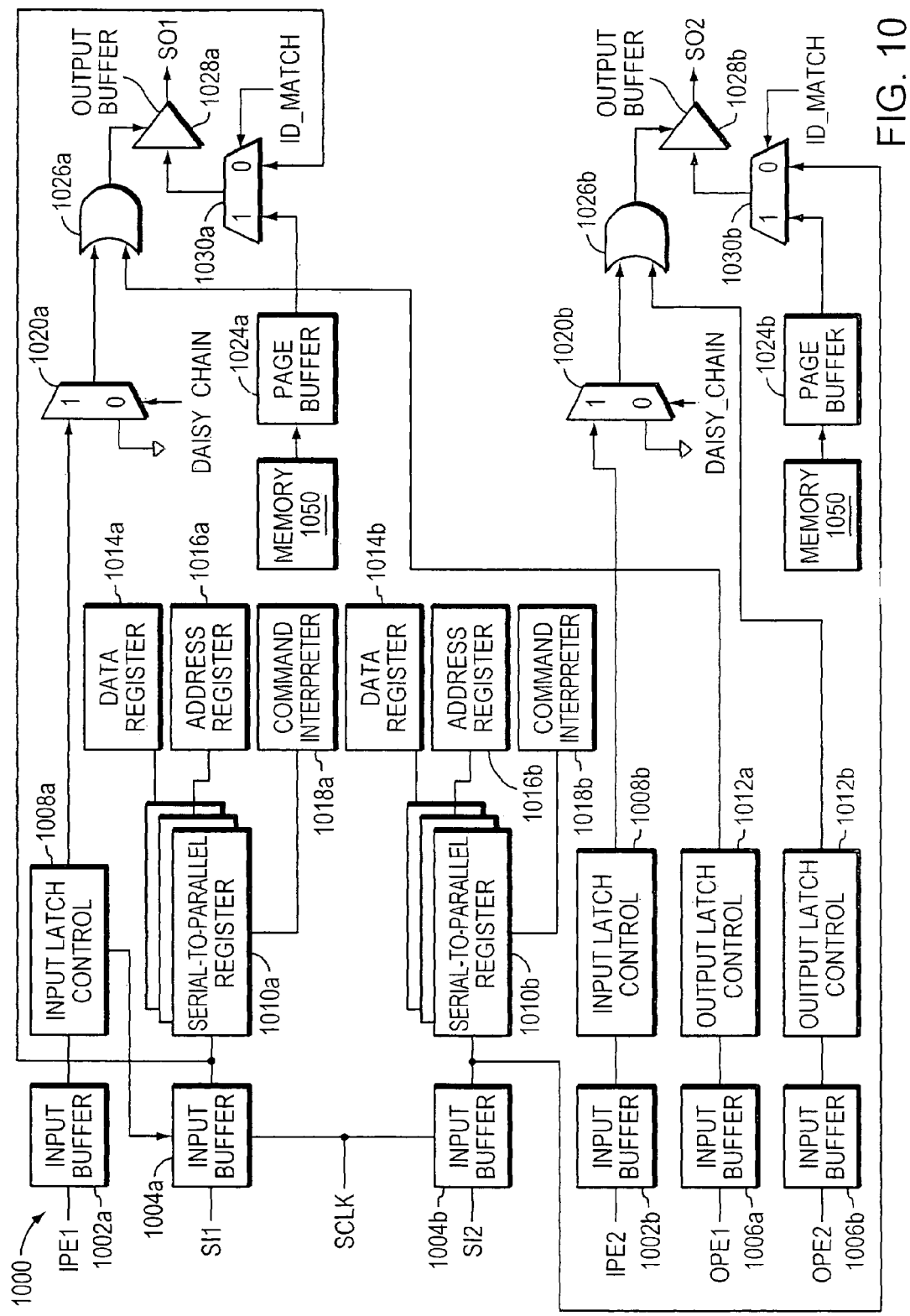
FIG. 10 is a high-level block diagram of exemplary serial output control logic for a dual ported device.

FIG. 10 is a block diagram of exemplary serial output control logic 1000 for a dual ported device. For each port, the serial output control logic 1000 comprises an IPE input buffer 1002, SI input buffer 1004, OPE input buffer 1006, input latch control 1008, serial-to-parallel register 1010, output latch control 1012, data register 1014, address register 1016, command interpreter 1018, selector 1020, page buffer 1024, logical OR gate 1026, output buffer 1028 and selector 1030 which are identical to the above described IPE input buffer 902, SIP input buffer 904, OPE input buffer 906, input latch control 908, serial-to-parallel register 910, output latch control 912, data register 914, address register 916, command interpreter 918, selector 920, page buffer 924, logical OR gate 926, output buffer 928 and selector 930, respectively.

Figure 11:
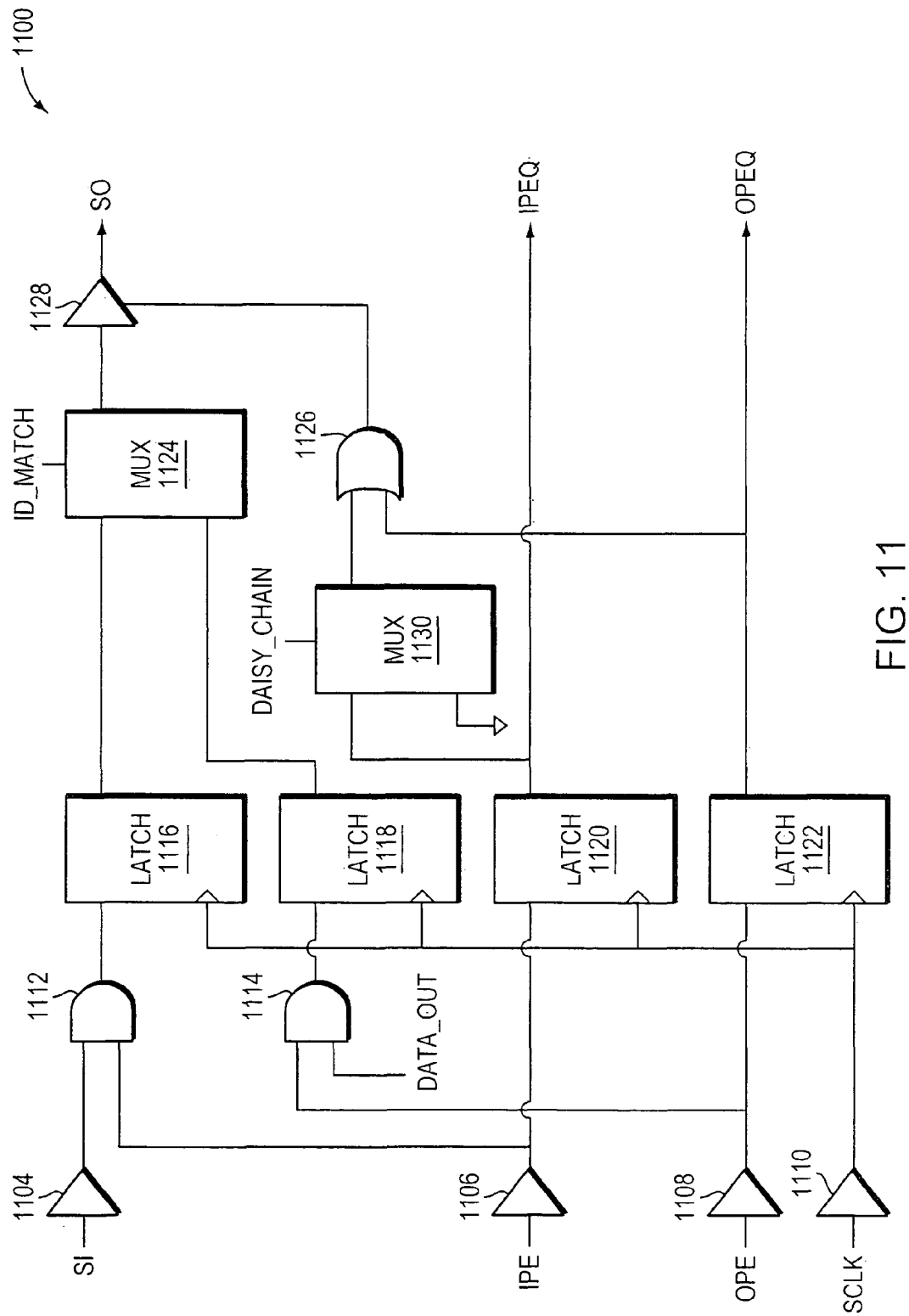
FIG. 11 is a detailed block diagram of exemplary serial output control logic for a device.

FIG. 11 is a detailed block diagram of another embodiment of serial output control logic 1100 that may be used with the techniques described herein. Logic 1100 comprises an SI input buffer 1104, an IPE input buffer 1106, an OPE input buffer 1108, an SCLK input buffer 1110, logical AND gates 1112 and 1114, latches 1116, 1118, 1120 and 1122, selectors 1124 and 1130, logical OR gate 1126 and an SO output buffer 1128. Buffers 1104, 1106, 1108 and 1110 are conventional LVTTL buffers configured to buffer SI, IPE, OPE and SCLK signals, respectively, that are inputted to the device.

AND gate 1112 is configured to output the information input to the SI to latch 1116 when IPE is asserted. Latch 1116 is configured to latch the information when a clock signal (SCLK) is provided by buffer 1110. DATA_OUT represents the state of data read from a memory (not shown) contained in the device. AND gate 1114 is configured to output a state of DATA_OUT when OPE is asserted. The output of AND gate 1114 feeds latch 1118 which is configured to latch the state of DATA_OUT when a clock signal is provided by buffer 1110. Buffer 1106 is configured to buffer the IPE signal fed to the device. The output of buffer 1106 is latched by latch 1120. Likewise, buffer 1108 is configured to buffer the OPE signal fed to the device. Latch 1122 is configured to latch the state of OPE as output by buffer 1108. Selectors 1124 and 1130 are conventional 2-to-1 multiplexers each comprising two inputs. The inputs for selector 1124 are selected for output from the selector 1124 by the above-described ID_MATCH signal. One input is fed with the latched state of DATA_OUT as maintained by latch 1118. This input is selected for output from selector 1124 when ID_MATCH is asserted. The other input is fed with the latched state of SI as maintained by latch 1116. This input is selected for output from the selector 1124 when ID_MATCH is not asserted.

The inputs for selector 1130 are selected for output from the selector 1130 by the above-described DAISY_CHAIN signal. One input to selector 1130 is fed with the latched state of IPE as maintained by latch 1120 and the other input is tied to a logical zero. The latched state of IPE is selected for output from the selector 1130 when DAISY_CHAIN is asserted. Likewise, when DAISY_CHAIN is not asserted, logical zero is selected for output from the selector 1130.

OR gate 1126 is a conventional logical OR gate configured to provide an enable/disable signal to output buffer 1128. OR gate 1126 is fed with the output of selector 1130 and the latched state of OPE, as maintained by latch 1122. Either of these outputs may be used to provide an enable signal to buffer 1128 to enable the buffer's output. Buffer 1128 is a conventional buffer that buffers output signal SO. As noted above, buffer 1128 is enabled/disabled by the output of OR gate 1126.

Operationally, when IPE is asserted, information that is input to the device via SI is fed to latch 1116. Latch 1116 latches this information illustratively at the first upward transition of SCLK after IPE is asserted. Likewise, latch 1120 latches the state of IPE at this SCLK transition. Assuming ID_MATCH is not asserted, the output of latch 1116 is fed to buffer 1128 via selector 1124. Likewise, the asserted IPE is transferred from buffer 1106 to latch 1120 where it is also illustratively latched by the first upward transition of SCLK. Assuming DAISY_CHAIN is asserted, the latched state of IPE is provided at the output of selector 1130 and transferred to OR gate 1126 to provide an enable signal to buffer 1128. The latched state of SI is then transferred from the device via buffer 1128 as output SO.

When DAISY_CHAIN is not asserted, the logical zero input to selector 1130 is selected which outputs a logical zero from selector 1130. This effectively disables IPE from enabling buffer 1128.

Illustratively, at the next upward transition of SCLK after OPE is asserted, the asserted state of OPE is latched at latch 1122 and the state of DATA_OUT is latched at latch 1118. Assuming ID_MATCH is asserted, the latched state of DATA_OUT is selected by selector 1124 and applied to the input of buffer 1128. Simultaneously, the latched asserted state of OPE from latch 1122 passes through OR gate 1126 to enable buffer 1128 which causes the latched state of DATA_OUT to be output from the device as output SO.

Figure 12:
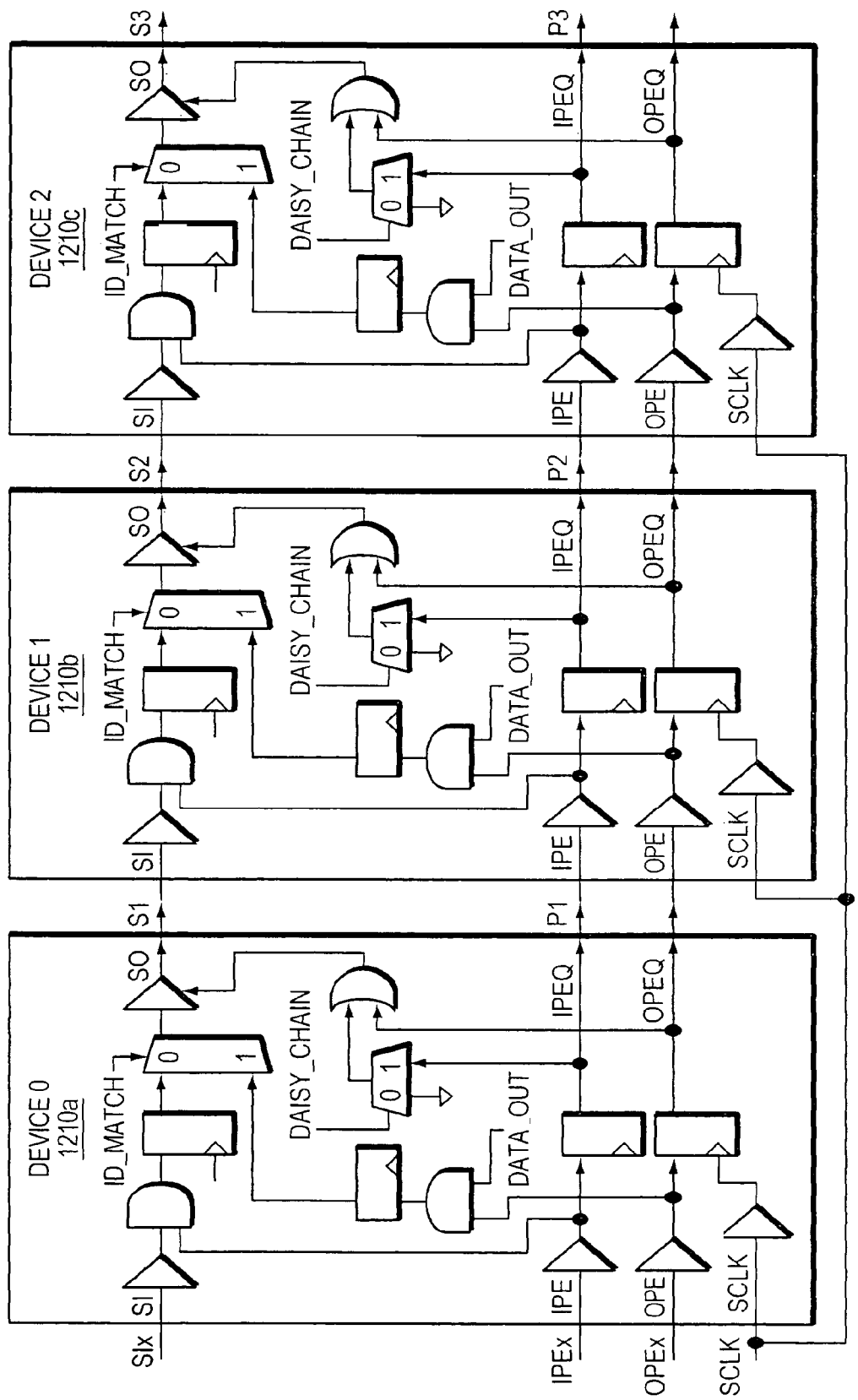
FIG. 12 is a block diagram of an exemplary configuration of devices configured in a serial daisy chain cascading arrangement and containing exemplary serial output control logic.

FIG. 12 is a block diagram of an exemplary configuration of devices configured in a serial daisy chain cascading arrangement and containing exemplary serial output control logic. The arrangement comprises three devices 1210 configured such that outputs of an earlier device in the daisy chain cascade are coupled to inputs of the next device in the daisy chain cascade, as described above. The transfer of information and data from one device to the next is described with reference to FIG. 13 below.

Figure 13:
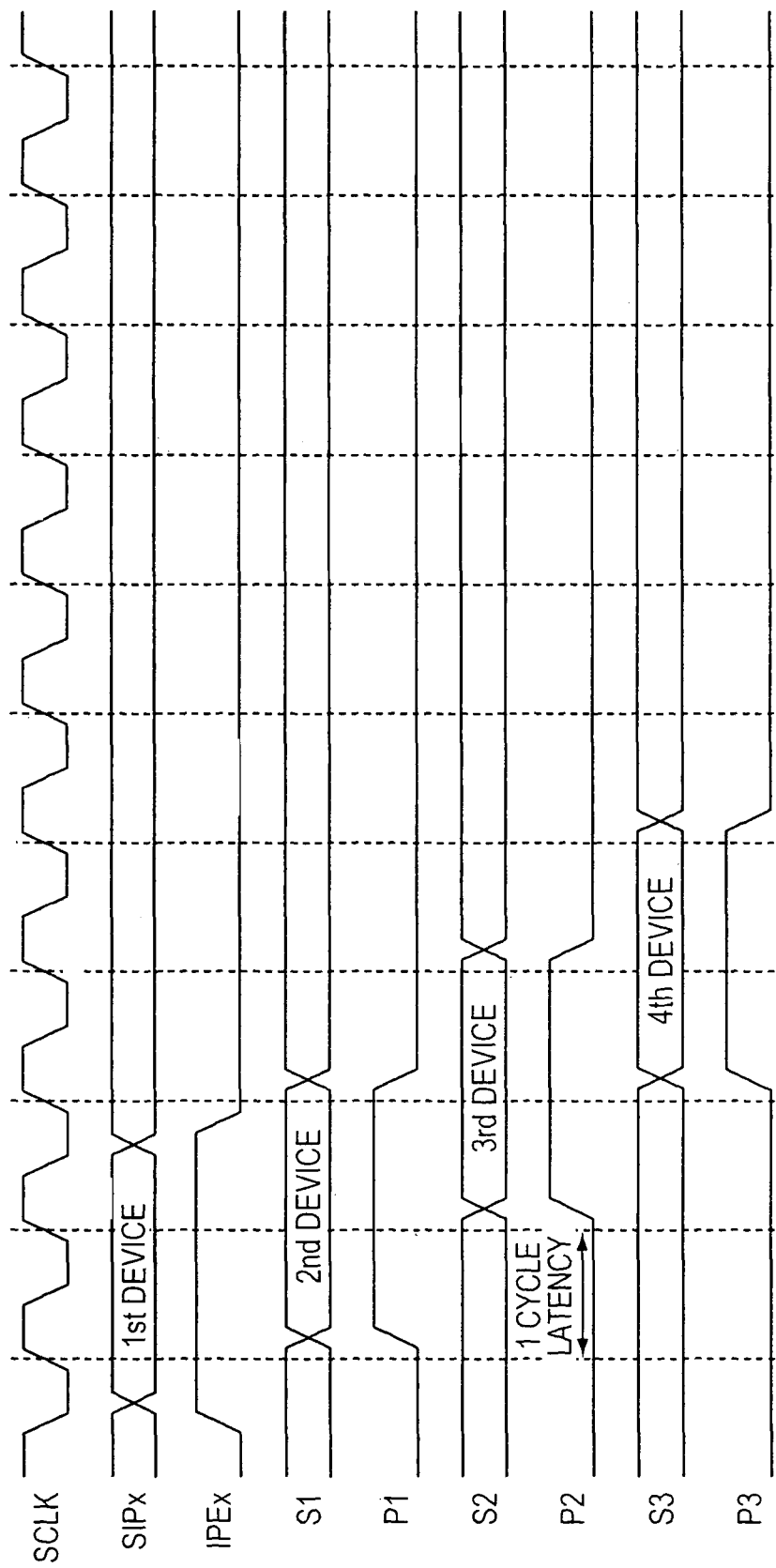
FIG. 13 is a timing diagram illustrating timing associated with inputs and outputs of the devices comprising exemplary serial output control logic.

FIG. 13 is an exemplary timing diagram illustrating timing associated with inputs and outputs of devices illustrated in FIG. 12. Specifically, the diagram illustrates the operation of the serial output control logic 1100 in each device with respect to passing information input at the SI input of each device 1210 to the SO output of the device 1210.

Referring to FIGS. 11, 12 and 13, assume DAISY_CHAIN is asserted. When IPE is asserted at device 1210a, information at the device's SI input is passed through the device's serial output control logic 1100, as described above, to the SO output of the device 1210a. Specifically, data is clocked into device 1210a illustratively at each rising edge of SCLK after IPE is asserted. The information and state of IPE propagates through the logic 1100, as described above, and exits the device 1210a at the device's SO and IPEQ outputs, respectively. These outputs are represented in the diagram as S1 and P1, respectively. These outputs are fed to the SI and IPE inputs of device 1210b, pass through the serial output control logic 1100 of the device 1210b, as described above, and are output from device 1210b at the device's SO and IPEQ outputs one clock cycle later. These outputs are represented in the diagram as S2 and P2, respectively. Likewise, the SO and IPEQ outputs of device 1210b are fed to the SI and IPE inputs of device 1210c, respectively, pass through the serial output control logic 1100 of device 1210c and are output from the device 1210c at the device's SO and IPEQ outputs, respectively, one clock cycle later. These outputs are represented in the diagram as S3 and P3, respectively.

In the daisy chain cascade arrangements described above, the output latency of signals in the daisy chain cascade for SDR operation may be determined using the following formula:

$$\text{output\_latency} = N * \text{clock\_cycle\_time}$$

where:
"output_latency" is the output latency of the data,
"N" is the number of devices in the daisy chain cascade arrangement and
"clock_cycle_time" is the clock cycle time at which the clock (e.g., SCLK) operates.

For example, assume the clock_cycle_time for the daisy chain cascade illustrated in FIG. 12 is 10 nanoseconds. The total output latency for the data at the SO of device 1210c is 3*10 nanoseconds or 30 nanoseconds.

In the case of DDR operation, the output latency may be determined as follows:

$$\text{output\_latency} = N * (\text{clock\_cycle\_time}/2)$$

In DDR operation both edges of the clock may act as latch points of input data and change points of output data. Thus, the total latency is half the latency for SDR operation.

Note that in the above description, the information input to a device 1210 is output one clock cycle later for SDR operation and one half cycle later for DDR operation. This delay is introduced to accommodate the time it takes to activate the output buffer 1128.

Figure 14:
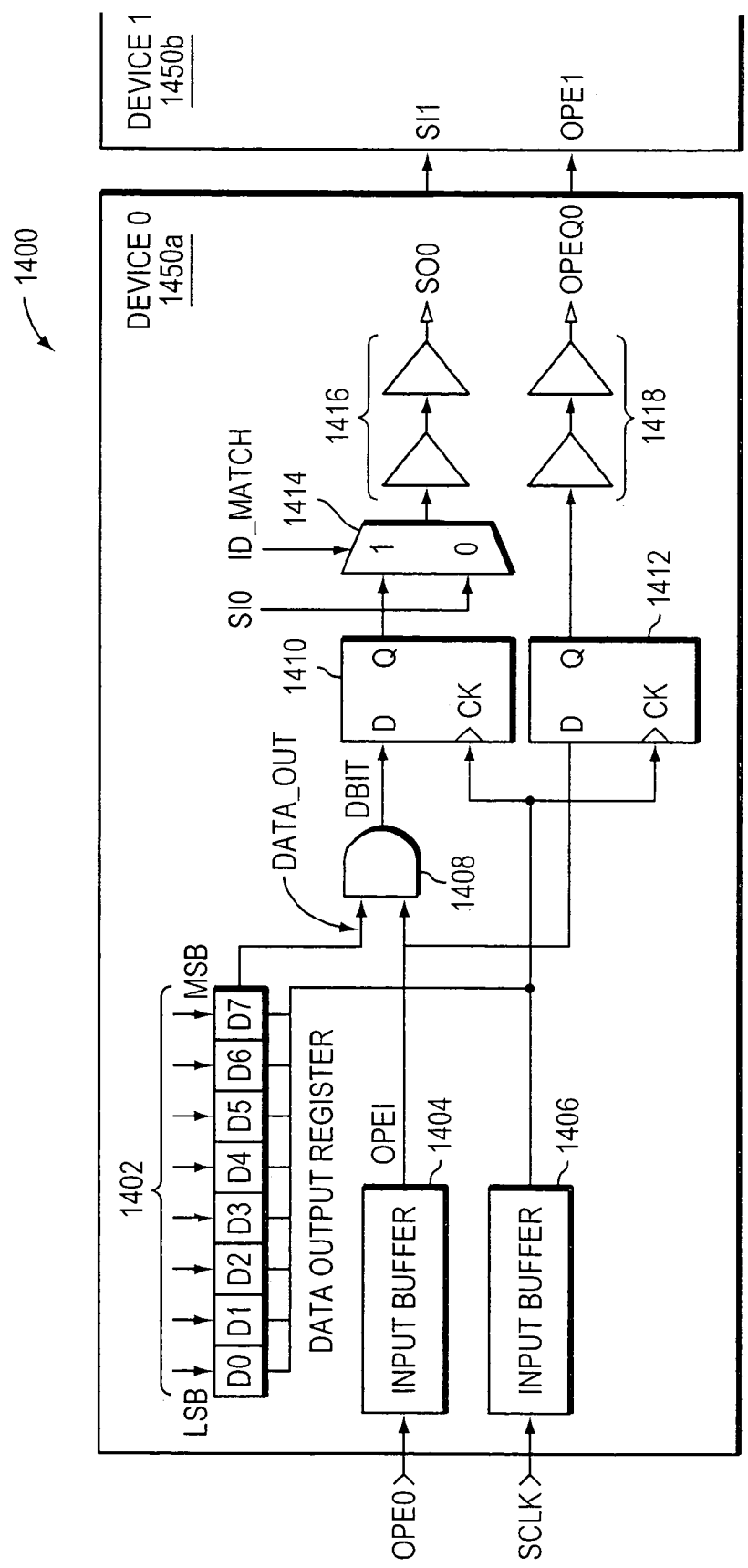
FIG. 14 is a block diagram of exemplary serial output control logic that may be used to transfer data from memory contained in a first device in a daisy chain cascade to a second device in the daisy chain cascade.

FIG. 14 is a block diagram of logic 1400 that may be used to transfer data contained in memory of a first device 1450a in a daisy chain cascade to a second device 1450b in the daisy chain cascade. Logic 1400 comprises a data output register 1402, an OPE input buffer 1404, an SCLK input buffer 1406, an AND gate 1408, a data output latch 1410, an OPE state latch 1412, a selector 1414, an SO output buffer 1416 and an OPEQ output buffer 1418.

The data output register 1402 is a conventional register configured to store data read from memory contained in the device 1450. The register 1402 is illustratively a parallel-to-serial data register that loads data in parallel from memory and serially transfers the data to an input of gate 1408. SCLK provides clocks that are used by register 1402 to transfer the data to gate 1408. As illustrated, data register 1402 is configured to hold a byte of data comprising bits D0 through D7 where D0 is the least-significant bit (LSB) of the byte and bit D7 is the most-significant bit (MSB) of the byte. The register 1402 is loaded in parallel with a byte's width of data from memory. The data is then shifted from the register and serially fed bit-by-bit to the input of gate 1408 starting with the MSB.

Buffers 1404 and 1406 are conventional LVTTL buffers used to buffer input signals OPE and SCLK, respectively. The OPE signal is transferred from the output of buffer 1404 (OPEI) to gate 1408. The SCLK signal is transferred from the output of buffer 1406 to data output register 1402 and, latches 1410 and 1412 to provide a clock to these components.

Gate 1408 is a conventional logic AND gate which is configured to transfer the output of the data output register 1402 (DATA_OUT) to latch 1410 when OPE is asserted. The output of gate 1408 is designated as "DBIT". Latches 1410 and 1412 are conventional latches configured to latch the state of DBIT and the OPE signal, respectively. Selector 1414 is a conventional two input 2-to-1 multiplexer that is controlled by the signal ID_MATCH. One of the data inputs is fed with the latched state of DBIT. This state is output from the selector 1414 when ID_MATCH is asserted. The other input is fed with serial information (SI0) inputted to the device 1450a via its SI. This information is outputted by the selector 1414 when ID_MATCH is not asserted.

Buffers 1416 and 1418 are conventional buffers configured to buffer the output of selector 1414 and latch 1406, respectively. The output of buffer 1416 exits the device 1450a as SO (SO0) and the output of buffer 1418 exits the device 1450a as OPEQ (OPEQ0).

Figure 15:
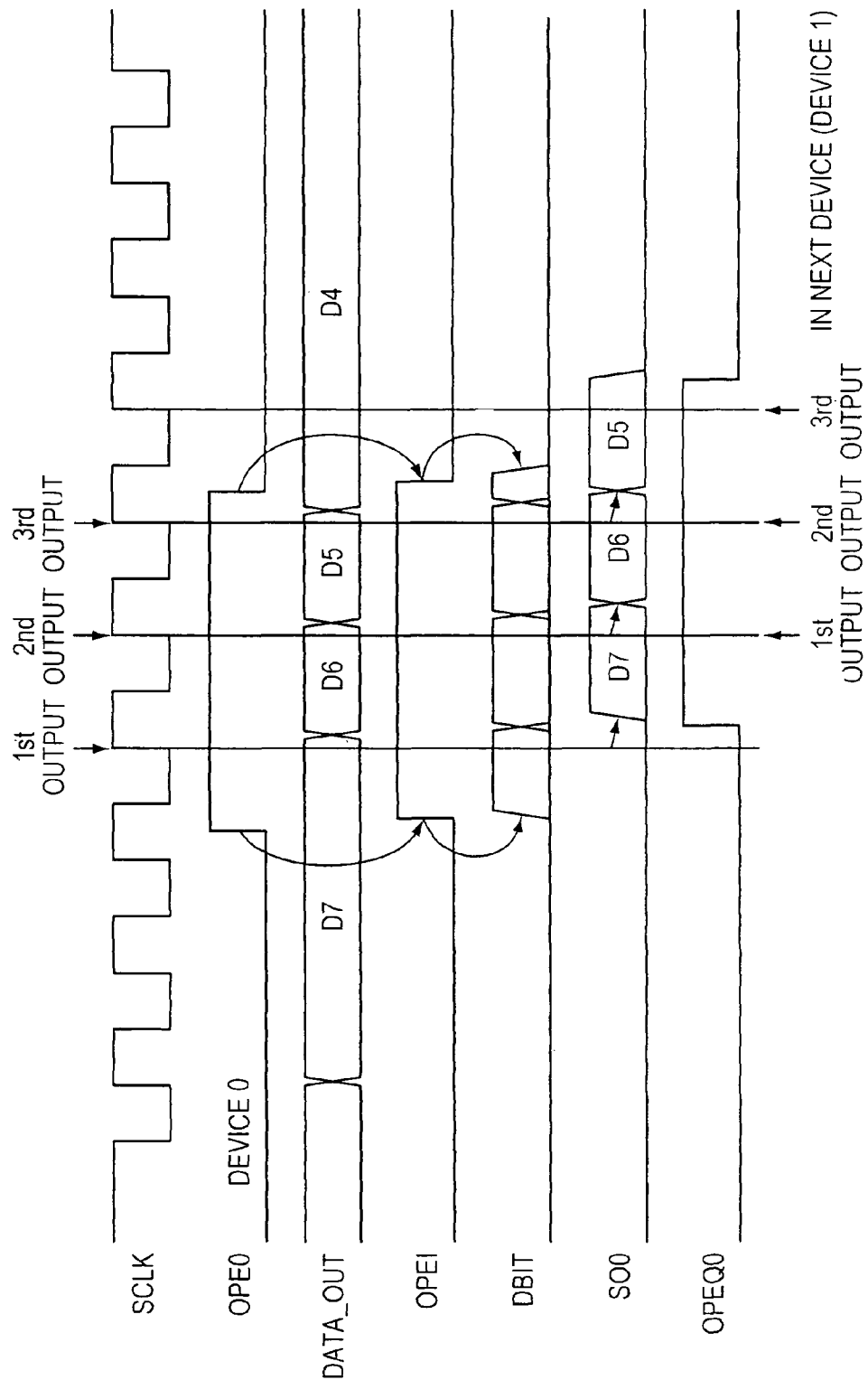
FIG. 15 is a timing diagram illustrating timing associated with transferring data contained in memory of a first device in a daisy chain cascade to a second device in the daisy chain cascade using exemplary serial output control logic.

FIG. 15 is a timing diagram illustrating timing associated with transferring a byte's width of data from memory contained in device 1450a to device 1450b using logic 1400. Referring to FIGS. 14 and 15, OPEI is asserted shortly after OPE is fed to the device 1450a at input buffer 1404. OPEI is fed to gate 1408 to enable the data present in D7 of the data output register 1402 to be latched at latch 1410 at the next rising edge of SCLK. In addition, this next rising edge of SCLK causes data to be right-shifted in data output register 1402 such that data in D6 is shifted into D7, data in D5 is shifted into D6 and so on. The output of latch 1410 is presented to selector 1414 which, assuming ID_MATCH is asserted, outputs the latched state of the data to buffer 1416. Buffer 1416 outputs this latched state from the device 1450a as SO0 which is fed to the SI input (SI1) of the next device 1450b of the daisy chain cascade. Meanwhile, also at the rising edge of the first clock after OPE is asserted, the state of OPE is latched at latch 1412. The output of latch 1412 is transferred to buffer 1418 which outputs the latched state of OPE from the device 1450a as OPEQ (OPEQ0) which is fed to the OPE input (OPEI) of the next device 1450b in the daisy chain cascade. This process is repeated for bits D6 through D0.

While this invention has been particularly shown and described with references to preferred embodiments thereof, it will be understood by those skilled in the art that various changes in form and details may be made therein without departing from the scope of the invention encompassed by the appended claims.

What is claimed is:

1. A flash memory system comprising:
a plurality of flash memory devices including at least a first flash memory device and a second flash memory device, the plurality of flash memory devices being connected in a serial arrangement with each other,
the first flash memory device having
a control input port configured to receive a first input enable signal,
a data input port,
a data input circuit coupled to the data input port, the data input circuit being configured to receive the first input enable signal from the control input port through a first control signal path,
a data output port,
a data output circuit coupled to the data output port, the data output circuit being coupled to the control input port through a second control signal path, the second control signal path including
an output control circuit configured to receive the first input enable signal from the control input port and to output a control signal having an active logic level to the data output circuit when the first input enable signal is at an active logic level,
a clock input port, and
a control output port,
the first flash memory device configured
to receive
first input information at the data input port in a predetermined sequence including a p-byte target device address, a q-byte command, and an r-byte address, synchronously with a clock signal received at the clock input port, each of p, q and r being an integer value equal to or greater than 1, and
the first input enable signal having an active logic level at the control input port from an external source device, the data input circuit configured to capture the received first input information when the first input enable signal is at an active logic level to enable the data output circuit in response to the control signal at an active logic level, and to output the captured first input information through the enabled data output circuit as output information from the data output port and a second input enable signal from the control output port; and
the second flash memory device being associated with a unique device identification number and having
a data input port,
a data output port
a clock input port, and
a control input port,
the second flash memory device configured
to capture the output information of the first flash memory device as second input information at its data input port while the second input enable signal is at the predetermined logic level at the control input port, and
to compare the p-byte target device address included in the captured second input information to the unique device identification number of associated with the second flash memory to determine whether the second flash memory device is a target device.

2. The flash memory system of claim 1 wherein the second input enable signal is the first input enable signal delayed.

3. The flash memory system of claim 1 wherein the second input enable signal is derived from the first input enable signal.

4. The flash memory system of claim 1 wherein the external source device comprises a controller.

5. The flash memory system of claim 1 wherein the external source device comprises another flash memory device.

6. The flash memory system of claim 1 wherein the predetermined sequence begins with the p-byte target device address, followed by the q-byte command, and followed by the r-byte address.

7. The flash memory system of claim 6 wherein the first input information includes input data received after the r-byte address, and the first flash memory device is configured to parse the p-byte target device address of the first input information, and the second flash memory device is configured to parse the p-byte target device address of the second input information to determine whether it is the target device by matching the p-byte target device address with its unique device identification number.

8. The flash memory system of claim 7 wherein each of the first flash memory device and the second flash memory device is further configured to parse the p-byte target device address prior to processing the q-byte command.

9. The flash memory system of claim 8 where each of the first flash memory device and the second flash memory device is further configured to ignore the q-byte command if the p-byte target device address mismatches its unique device identification number.

10. The flash memory system of claim 1, wherein the first flash memory device further includes
a second control input port configured to receive an output enable signal from the external source device, and a second control output port configured to send a second output enable signal, the control input port of the first flash memory device being a first control input port, and the control output port of the first flash memory device being a first control output port; and
the second flash memory device further includes a second control input port configured to receive the second output enable signal from the first flash memory device, the control input port of the second flash memory device being a first control input port.

11. The flash memory system of claim 1, wherein the clock signal is communicated in a cascading signal to each of the first flash memory device and the second flash memory device.

12. The flash memory system of claim 1, wherein the clock signal is communicated to each of the at least first flash memory device and the second flash memory device in parallel, and an output of the flash memory system is delayed by a predetermined latency.

13. The flash memory system of claim 6 wherein each of the first flash memory device and the second flash memory device further includes
a flash memory bank;
data transfer circuitry configured to receive input data after the r-byte address at the data input port and to transfer the input data to the flash memory bank, and to transfer output data read from the flash memory bank to the data output port; and control circuitry for controlling write data transfer between the data transfer circuitry and the flash memory bank, and read data transfer between the data transfer circuitry and the data output port.

14. The flash memory system of claim 13 wherein the flash memory bank comprises a NAND flash memory bank.

15. A semiconductor memory device comprising:
memory;
a control input port configured to receive an input enable signal;
a clock input port for receiving a clock signal;
a data input port configured to receive input information in a predetermined sequence including a p-byte target device address, a q-byte command, and an r-byte address, synchronously with the clock signal, each of the p, q and r being an integer value equal to or greater than 1,
a data input circuit coupled to the data input port, the data input circuit being configured to receive the input enable signal from the control input port through a first control signal path, the data input circuit configured to capture the received input information when the input enable signal is at an active logic level,
a data output port,
a data output circuit coupled to the data output port, the data output circuit being coupled to the control input port through a second control signal path, the second control signal path including
an output control circuit configured to receive the input enable signal from the control input port and to output a control signal having an active logic level to the data output circuit when the input enable signal is at an active logic level, the data output circuit being enabled in response to the control signal at an active logic level, the data output port outputting the captured input information through the enabled data output circuit;
a unique device identification number, the unique device identification number being used to determine whether the semiconductor memory device possessing the unique device identification number is to be responsive to the q-byte command;
control circuitry for determining whether the p-byte target device address relates to the unique device identification number, and providing a determination result;
data transfer circuitry configured to respond to the q-byte command in response to the determination result and to provide one of read data and the input information as output data from the data output port.

16. The semiconductor memory device of claim 15 wherein the memory comprises a plurality of memory banks.

17. The semiconductor memory device of claim 15 wherein the output data contains the p-byte target device address; and the control circuitry is configured to control data transfer between the data transfer circuitry and the memory, and between the data transfer circuitry and the data output port.

18. The semiconductor memory device of claim 17, wherein the data transfer occurs at a double data rate in response to the rising and falling edges of the clock signal.

19. The semiconductor memory device of claim 17, wherein the input information includes serial information, and the data transfer circuitry is further configured to convert serial write data of the serial information into parallel write data and to transfer the parallel write data to the memory.

20. The semiconductor memory device of claim 19, wherein the data transfer circuitry is further configured to convert parallel read data from the memory into serial read data.

21. The semiconductor memory device of claim 20, wherein the control circuitry is configured to receive executable instructions corresponding to the q-byte command to control the transfer of serial write data to the memory, and the transfer of the serial read data from the memory.

22. The semiconductor memory device of claim 19, wherein the control circuitry is programmed with executable instructions to parse the p-byte target device address of the serial information and to control the transfer of the parallel write data to a location in the memory identified in the r-byte address of the captured input information.

23. The semiconductor memory device of claim 15, wherein the memory, the data transfer circuitry and the control circuitry are located within a single package having a one-side pad architecture.

24. The semiconductor memory device of claim 15, wherein the memory comprises a non-volatile memory bank.

25. The semiconductor memory device of claim 24, wherein the non-volatile memory bank comprises a flash memory bank.

26. The semiconductor memory device of claim 24, wherein the non-volatile memory bank comprises a NAND flash memory bank.

27. A memory system having a plurality of memory devices that are serially connected, the plurality of memory devices comprising at least first and second memory devices, an access to the first and the second memory devices being determined by device identification,
the first memory device having
(a) memory,
(b) a first unique device identifier,
(c) a control input port configured to receive an input enable signal,
(d) a data input port,
(e) a data input circuit coupled to the data input port, the data input circuit being configured to receive the input enable signal from the control input port through a first control signal path,
(f) a data output port,
(g) a data output circuit coupled to the data output port, the data output circuit being coupled to the control input port through a second control signal path, the second control signal path including
an output control circuit configured to receive the input enable signal from the control input port and to output a control signal having an active logic level to the data output circuit when the input enable signal is at an active logic level,
(h) a control output port,
(i) a clock input port,
the data input circuit being configured to capture input information in a predetermined sequence including a p-byte target device address, a q-byte command, and r-byte address, synchronously with a clock signal received at the clock input port, at the data input port from an external source device when the input enable signal is at an active logic level, each of p, q and r being an integer value equal to or greater than 1, and
the data output circuit being enabled in response to the control signal at an active logic level to send one of the input information in response to the input enable signal driven at an active logic level and read data as output data from the data output port, and to send the input enable signal from the control output port, and further configured to process the q-byte command if the first memory device is identified as a target device when the p-byte target device address relates to the first unique device identifier of the first memory device; and the second memory device having
(a) a second unique device identifier,
(b) a data input port, in communication with the data output port of the first memory device, and
(c) a data output port,
(d) a control input port,
(e) a clock input port the second memory device being configured to capture the input information from the first memory device at the data input port of the second memory device in response to the input enable signal provided by the control output port of the first memory device which is received at the control input port of the second memory device while the input enable signal is driven at the logic level, and to process the captured input information if the second memory device is identified as the target device when the p-byte target device address relates to the second unique device identifier of the second memory device.

28. The memory system of claim 27 wherein the external source device comprises a controller.

29. The memory system of claim 27 wherein the external source device comprises a memory device.

30. The memory system of claim 27 wherein the second memory device is further configured to send at least the output data received at its data input port to an external target device through its data output port.

31. The memory system of claim 27 wherein each of the at least first and second memory devices of the plurality of memory devices is further configured to bypass the q-byte command without processing if neither the first memory device nor the second memory device is identified as the target device when the p-byte target device address is unrelated to either of the first unique device identifier and the second unique device identifier.

32. The memory system of claim 27 wherein the memory of the first memory device comprises a flash memory.

33. The memory system of claim 27 wherein the memory of the first memory device comprises a NAND flash memory.

34. The semiconductor memory device of claim 15, wherein the control circuitry is configured to determine whether the p-byte target device address matches the unique device identification number to provide the determination result.

35. The memory system of claim 27, wherein:
the first memory device is configured to determine whether the p-byte target device address matches the first unique device identifier of the first memory device to identify the first memory device as the target device; and
the second memory device is configured to determine whether the p-byte target device address matches the second unique device identifier of the second memory device to identify the second memory device as the target device.

36. The memory system of claim 31, wherein:
the first memory device is configured to determine whether the p-byte target device address matches the first unique device identifier of the first memory device, the q-byte command being bypassed if the p-byte target device address mismatches the first unique device identifier; and
the second memory device is configured to determine whether the p-byte target device address matches the second unique device identifier of the second memory device, the q-byte command being bypassed if the p-byte target device address mismatches the second unique device identifier.

37. The semiconductor memory device of claim 15, wherein the control input port is a first control input port, and the semiconductor memory device further includes
a second control input port distinct from the data input port configured to receive an output enable signal for enabling the data output port to provide the output data.

38. The memory system of claim 27, wherein the control input port is a first control input port, and the first memory device further includes
a second control input port distinct from the data input port configured to receive an output enable signal for enabling the data output port to provide the output data.

39. The flash memory system of claim 1 wherein the r-byte address includes an r1-byte column address and an r2-byte row address, each of r1 and r2 being an integer value.

40. The flash memory system of claim 39 wherein r1=2.

41. The flash memory system of claim 39 wherein r2=3.

42. The flash memory system of claim 41 wherein the row address includes a bank address.

43. The flash memory system of claim 1 wherein the second flash memory device further includes a control output port configured to send the output information and a third input enable signal to an external target device.

44. The flash memory system of claim 10 wherein the output control circuit is configured to receive the output enable signal and output the control signal having an active logic level when the output enable signal is at an active logic level.

45. The semiconductor memory device of claim 37 wherein the output control circuit is configured to receive the output enable signal and output the control signal having an active logic level when the output enable signal is at an active logic level.

46. The memory system of claim 27 wherein the output control circuit is configured to receive the output enable signal and output the control signal having an active logic level when the output enable signal is at an active logic level.

47. An apparatus having a plurality of devices configured in a daisy chain cascade arrangement, the apparatus comprising:
a first memory device having:
(a) memory,
(b) a first input for receiving address information associated with a memory location in the memory,
(c) a first control input for receiving a first input enable signal that is used to enable the first input to receive the address information,
(d) a second control input for receiving a first output enable signal set to a first logic level for a duration of time,
(e) a first output for providing first output data contained in the memory location in the memory in response to the first output enable signal being at the first logic level for the duration of time,
(f) a first control output for providing a second input enable signal in response to the first input enable signal,
(g) a second control output for providing a second output enable signal in response to the first output enable signal, the second output enable signal being at the first logic level for the duration of time; and
a second memory device having;
(a) a first control input for receiving the second input enable signal from the first memory device, (b) a first input for receiving the first output data provided from the first memory device in response to the received second input enable signal, (c) a second control input for receiving the second output enable signal from the first memory device, (d) a first output configured to output second output data to a subsequent device in response to the received second output enable signal being at the first logic level for the duration of time, the second output data being one of the first output data received by the first input of second memory device and data provided by the second memory device.

48. A method for reading data from a plurality of devices configured in a daisy chain cascade arrangement, the method comprising:

inputting into a first input of a first memory device, address information associated with a memory location of memory contained in the first memory device;

inputting into a first control input of the first memory device, a first input enable signal that is used to enable the address information to be input to the first input of the first memory device;

outputting from a first control output of the first memory device, a second input enable signal;

receiving at a first control input of a second memory device, the second input enable signal;

accessing data in memory contained in the first memory device at the memory location;

inputting into a second control input of the first memory device, a first output enable signal set to a first logic level for a duration of time;

outputting from a first output of the first memory device, the accessed data in response to the first output enable signal being at the first logic level for the duration of time;

outputting from a second control output of the first memory device, a second output enable signal set to the first logic level for the duration of time;

receiving into a first input of the second memory device, the accessed data provided from the first output of the first memory device;

receiving into a second control input of the second memory device, the second output enable signal; and providing output data from a first output of the second memory device to a subsequent device in response to the second output enable signal, the output data being one of the accessed data and data provided by the second memory device.

49. An apparatus comprising:

means for inputting, into a first input of a first memory device, address information associated with a memory location of memory contained in the first memory device during an active logic state of an input enable signal;

means for accessing data in memory contained in the first memory device at the memory location; and means for coupling a first output of the first device to a first input of a second memory device to allow the accessed data to be transferred from the first memory device to the second memory device in response to an output enable signal set to an active logic state for a duration of time, the second memory device having a first output coupled to the first input of the second memory device through a data transfer path, the data transfer path being configured to transfer the data received by the first input to the first output of the second memory device, the first output of the second memory device being configured to transfer the data as read data to a subsequent device in response to an active logic state of the input enable signal.

50. A memory system for providing read data comprising:

a memory controller for providing address information corresponding to a memory location, an input enable signal and an output enable signal set to a first logic level for a duration of time, the memory controller configured for receiving the read data stored in the memory location:

a first memory device having a first input and a first output, the first input receiving the address information in response to the input enable signal, and the first output providing first output data corresponding to the address information in response to the output enable signal being at the first logic level for the duration of time;

a second memory device having a first input connected to the first output of the first device for receiving the first output data, the first output of the second memory device being configured to output second output data as the read data in response to the output enable signal being at the first logic level for the duration of time, the second output data being one of the first output data provided by the first memory device and data provided by the second memory device.

* * * * *